(12) United States Patent
Wang et al.

(10) Patent No.: US 11,373,601 B2
(45) Date of Patent: Jun. 28, 2022

(54) DISPLAY SUBSTRATE, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lingran Wang, Beijing (CN); Jun Yan, Beijing (CN); Wenhui Gao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/280,160

(22) PCT Filed: May 13, 2020

(86) PCT No.: PCT/CN2020/090003
§ 371 (c)(1),
(2) Date: Mar. 25, 2021

(87) PCT Pub. No.: WO2021/226870
PCT Pub. Date: Nov. 18, 2021

(65) Prior Publication Data
US 2022/0114969 A1   Apr. 14, 2022

(51) Int. Cl.
*G09G 3/32* (2016.01)
*G09G 3/3266* (2016.01)

(52) U.S. Cl.
CPC ..... *G09G 3/3266* (2013.01); *G09G 2300/0842* (2013.01); *G09G 2310/0286* (2013.01); *G09G 2310/061* (2013.01); *G09G 2330/021* (2013.01)

(58) Field of Classification Search
CPC .. G09G 3/3208; G09G 3/3225; G09G 3/3266; G09G 2300/0426;
(Continued)

(56) References Cited

U.S. PATENT DOCUMENTS 5,798,742 A * 8/1998 Watatani ............. G09G 3/3688
345/98
9,412,645 B1 * 8/2016 Or-Bach ............ H03K 19/1778
(Continued)

FOREIGN PATENT DOCUMENTS

CN   107909959 A   4/2018
CN   109935187 A   6/2019
(Continued)

*Primary Examiner* — Michael J Eurice
(74) *Attorney, Agent, or Firm* — McCoy Russell LLP

(57) ABSTRACT

The present disclosure provides a display substrate, a manufacturing method and a display device. The display substrate includes a scan driving circuit, at least one shift register unit includes an output circuit, a first energy storage circuit, and a first leakage prevention circuit; the scan driving circuit also includes a first voltage signal line and a second voltage signal line; a first voltage signal line is located on a side of the second voltage signal line away from the display area; the output circuit is respectively coupled to the first voltage signal line and the second voltage signal line, the first energy storage circuit is respectively coupled to the output circuit and the second voltage signal line, the first leakage prevention circuit is coupled to the output circuit; the output circuit is arranged between the first voltage signal line and the second voltage signal line.

33 Claims, 8 Drawing Sheets

(58) Field of Classification Search
CPC ... G09G 2300/0842; G09G 2310/0264; G09G 2310/0286; G09G 2310/061; G09G 2320/0209; G09G 2320/0214; G09G 2330/021; H01L 27/3244; H01L 27/3276; H01L 27/3265; H01L 27/10835; H01L 27/10867

See application file for complete search history.

(56) References Cited

U.S. PATENT DOCUMENTS

| | | | |
|---|---|---|---|
| 2010/0207928 A1* | 8/2010 | Lee | G09G 3/3677 345/213 |
| 2011/0157112 A1 | 6/2011 | Shibata et al. | |
| 2016/0322116 A1* | 11/2016 | Jang | G09G 3/3266 |
| 2019/0080658 A1* | 3/2019 | Yamamoto | G09G 3/3677 |
| 2019/0096308 A1 | 3/2019 | Lv et al. | |
| 2020/0052085 A1* | 2/2020 | Park | H01L 29/4908 |
| 2020/0126466 A1* | 4/2020 | Hosoyachi | G09G 3/3677 |
| 2020/0143747 A1* | 5/2020 | Kim | G09G 3/3266 |
| 2021/0125557 A1* | 4/2021 | Na | G09G 3/3233 |

FOREIGN PATENT DOCUMENTS

| | | |
|---|---|---|
| CN | 106940977 B | 7/2019 |
| CN | 110518022 A | 11/2019 |

\* cited by examiner

DISPLAY SUBSTRATE, MANUFACTURING METHOD THEREOF, AND DISPLAY DEVICE

CROSS REFERENCE TO RELATED APPLICATION

The present application is a U.S. National Phase of International Application No. PCT/CN2020/090003 entitled "DISPLAY SUBSTRATE, MANUFACTURING METHOD THEREOF, AND DISPLAY DEVICE," and filed on May 13, 2020. The entire contents of the above-listed application is hereby incorporated by reference for all purposes.

TECHNICAL FIELD

The present disclosure relates to the field of display technology, in particular to a display substrate, a manufacturing method thereof, and a display device.

BACKGROUND AND SUMMARY

Active-Matrix Organic Light emitting Diode (AMOLED) display panels are widely used in various fields due to their low power consumption, low production cost, and wide color gamut.

The AMOLED display panel includes a pixel circuit located in the display area and a scan driving circuit located in a peripheral area. The pixel circuit includes a plurality of sub-pixel circuits arranged in an array. The scan driving circuit includes a plurality of shift register units. Each shift register unit is used to provide a light emitting control signal for the corresponding sub-pixel circuit. When the shift register unit is in operation, a current leakage may occur for the transistor whose gate is electrically connected to the node due to the large change of the potential at the node, which causes the output error of the shift register unit.

An object of the present disclosure is to provide a display substrate, a manufacturing method thereof, and a display device.

In one aspect, the present disclosure provides in some embodiments a display substrate, including a scan driving circuit provided on a base substrate, wherein the scan driving circuit includes a plurality of shift register units, at least one shift register unit of the plurality of shift register units comprises an output circuit, a first energy storage circuit and a first leakage prevention circuit, the scan driving circuit further includes a first voltage signal line and a second voltage signal line, the first voltage signal line is used to provide a first voltage, the second voltage signal line is used to provide a second voltage; the first voltage signal line is located on a side of the second voltage signal line away from a display area; the output circuit is respectively coupled to the first voltage signal line and the second voltage signal line, the first energy storage circuit is respectively coupled to the output circuit and the second voltage signal line, the first leakage prevention circuit is respectively coupled to the output circuit and the first voltage signal line; the output circuit is arranged between the first voltage signal line and the second voltage signal line; an orthographic projection of the first energy storage circuit on the base substrate partially overlaps an orthographic projection of the second voltage signal line on the base substrate; the first leakage prevention circuit is arranged on a side of the first voltage signal line away from the second voltage signal line.

In some embodiments of the present disclosure, the scan driving circuit further comprises a third voltage signal line and a fourth voltage signal line, the fourth voltage signal line is used to provide the first voltage, the third voltage signal line is used to provide the second voltage; the third voltage signal line is located on the side of the first voltage signal line away from the display area, and the fourth voltage signal line is located on a side of the third voltage signal line away from the display area; the orthographic projection of the first energy storage circuit on the base substrate partially overlaps an orthographic projection of the fourth voltage signal line on the base substrate; the first leakage prevention circuit is located between the first voltage signal line and the third voltage signal line.

In some embodiments of the present disclosure, the first voltage signal line, the second voltage signal line, the third voltage signal line, and the fourth voltage signal line all extend along a first direction.

In some embodiments of the present disclosure, the at least one shift register unit further comprises a reset control circuit; the reset control circuit is coupled to the output circuit; the reset control circuit is arranged between the first voltage signal line and the second voltage signal line.

In some embodiments of the present disclosure, the at least one shift register unit further comprises a second node control circuit, a second energy storage circuit, and a second leakage prevention circuit; the second node control circuit is coupled to the second energy storage circuit; the second leakage prevention circuit is respectively coupled to the first leakage prevention circuit and the first voltage signal line; the second node control circuit is arranged on the side of the first voltage signal line away from the second voltage signal line; an orthographic projection of the second energy storage circuit on the base substrate partially overlaps an orthographic projection of the first voltage signal line on the base substrate; the second leakage prevention circuit is located on the side of the first voltage signal line away from the second voltage signal line.

In some embodiments of the present disclosure, the at least one shift register unit further comprises a third node control circuit; the third node control circuit is located on the side of the first voltage signal line away from the second voltage signal line.

In some embodiments of the present disclosure, the scan driving circuit further comprises a third voltage signal line; the third voltage signal line is located on the side of the first voltage signal line away from the display area; the third node control circuit is coupled to the third voltage signal line; the third node control circuit is located between the first voltage signal line and the third voltage signal line.

In some embodiments of the present disclosure, the at least one shift register unit further comprises a fifth node control circuit; the scan driving circuit further comprises a third voltage signal line and a fourth voltage signal line; the third voltage signal line is located on the side of the first voltage signal line away from the display area, and the fourth voltage signal line is located on a side of the third voltage signal line away from the display area; the fifth node control circuit is respectively coupled to the fourth voltage signal line and the first energy storage circuit; the fifth node control circuit is located between the third voltage signal line and the fourth voltage signal line.

In some embodiments of the present disclosure, the scan driving circuit further comprises a first clock signal line and a second clock signal line that are arranged on a side of the fourth voltage signal line away from the display area; the first energy storage circuit is coupled to the first clock signal line; both the first clock signal line and the second clock signal line extend along the first direction.

In some embodiments of the present disclosure, the second voltage signal line, the first voltage signal line, the third voltage signal line, the fourth voltage signal line, the second clock signal line and the first clock signal line are arranged sequence along a direction away from the display area; or the second voltage signal line, the first voltage signal line, the third voltage signal line, the fourth voltage signal line, the first clock signal line, and the second clock signal lines are arranged in sequence along the direction away from the display area.

In some embodiments of the present disclosure, the display substrate further comprises a plurality of rows of pixel circuits arranged in the display area on the base substrate; the pixel circuit comprises a light emitting control terminal; the shift register unit further includes a signal output line; one shift register unit corresponds to one row of pixel circuits; the signal output line of the shift register unit is coupled to the light emitting control end of the corresponding row of pixel circuits, and is configured to provide a light emitting control signal for the light emitting control end of the corresponding row of pixel circuits.

In some embodiments of the present disclosure, the signal output line includes a first output line portion and a second output line portion; the first output line portion is located between the output circuit and the second voltage signal line; the first output line portion is coupled to the second output line portion, the first output line portion extends along a first direction, and the second output line portion extends along a second direction, the first direction intersects the second direction; the second output line portion extends to the display area to provide the light emitting control signal for a row of pixel circuits located in the display area.

In some embodiments of the present disclosure, the output circuit includes an output transistor and an output reset transistor; the output reset transistor and the output transistor are arranged along a first direction; a first electrode of the output reset transistor is coupled to the second voltage signal line, and a first electrode of the output transistor is coupled to the first voltage signal line; both a second electrode of the output transistor and a second electrode of the output reset transistor are coupled to a signal output line included in the at least one shift register unit.

In some embodiments of the present disclosure, a width of an active layer of the output reset transistor along a second direction is smaller than a width of an active layer of the output transistor along the second direction, the first direction intersects the second direction.

In some embodiments of the present disclosure, the at least one shift register unit further includes a reset control circuit; the reset control circuit includes a reset control transistor; the output circuit includes an output transistor and an output reset transistor; a gate electrode of the reset control transistor is coupled to a gate electrode of the output transistor, a first electrode of the reset control transistor is coupled to a first electrode of the output reset transistor, and a second electrode of the reset control transistor is coupled to a gate electrode of the output reset transistor.

In some embodiments of the present disclosure, the reset control transistor is located between the output reset transistor and the first voltage signal line; the reset control transistor includes a first active pattern, and the first active pattern extends along a first direction.

In some embodiments of the present disclosure, the first energy storage circuit includes an output reset capacitor; the output circuit includes an output reset transistor; an orthographic projection of a second electrode plate of the output reset capacitor on the base substrate is within an orthographic projection of a first electrode plate of the output reset capacitor on the baes substrate; the orthographic projection of the second electrode plate of the output reset capacitor on the base substrate partially overlaps an orthographic projection of the second voltage signal line on the base substrate; the first electrode plate of the output reset capacitor is coupled to a gate electrode of the output reset transistor; the second electrode plate of the output reset capacitor is coupled to the second voltage signal line through an electrode plate connection via hole.

In some embodiments of the present disclosure, the first leakage prevention circuit includes a first control transistor; the output circuit includes an output transistor; the first control transistor is located on the side of the first voltage signal line away from the display area; a first electrode of the first control transistor is coupled to a gate electrode of the output transistor.

In some embodiments of the present disclosure, the at least one shift register unit further comprises a second leakage prevention circuit; the second leakage prevention circuit includes a second control transistor, and the first leakage prevention circuit includes a first control transistor; the second control transistor is located on the side of the first voltage signal line away from the display area; a gate electrode of the first control transistor and a gate electrode of the second control transistor are coupled to each other; the gate electrode of the second control transistor is coupled to an electrode conductive connection portion, and there is an electrode overlap area between an orthographic projection of the electrode conductive connection portion on the base substrate and an orthographic projection of the first voltage signal line on the base substrate, the electrode conductive connection portion is coupled to the first voltage signal line through an electrode connection via hole provided in the electrode overlap area.

In some embodiments of the present disclosure, the scan driving circuit further comprises a third voltage signal line; the third voltage signal line is used to provide a second voltage; the at least one shift register unit further comprises a third node control circuit; the third node control circuit includes an input transistor, a first node control transistor, and a second node control transistor; an active layer of the input transistor, an active layer of the first node control transistor and an active layer of the second node control transistor are formed by a continuous second semiconductor layer; the second semiconductor layer extends along the first direction; the active layer of the input transistor includes a first third conductive portion, a third channel portion, and a second third conductive portion sequentially arranged along a first direction; the second third conductive portion is multiplexed as a first fourth conductive portion; the active layer of the first node control transistor includes the first fourth conductive portion, a fourth channel portion, and a second fourth conductive portion sequentially arranged along a first direction; the second fourth conductive portion is multiplexed as a first fifth conductive portion; the active layer of the second node control transistor includes the first fifth conductive portion, a fifth channel portion, and a second fifth conductive portion sequentially arranged along the first direction; a first electrode of the input transistor is coupled to the input terminal, and a first electrode of the second node control transistor is coupled to the third voltage signal line.

In some embodiments of the present disclosure, the input transistor, the first node control transistor, and the second node control transistor are located between the third voltage signal line and the first voltage signal line; the third voltage signal line extends along the first direction, and the third voltage signal line is located on the side of the first voltage signal line away from the display area.

In some embodiments of the present disclosure, the at least one shift register unit further comprises a second energy storage circuit and a second node control circuit; the second energy storage circuit includes a first capacitor, the second node control circuit includes a third node control transistor and a fourth node control transistor; an active layer of the fourth node control transistor and an active layer of the third node control transistor are formed by a continuous third semiconductor layer; the third semiconductor layer extends along the first direction; the active layer of the fourth node control transistor includes a first sixth conductive portion, a sixth channel portion, and a second sixth conductive portion sequentially arranged along the first direction; the second sixth conductive portion is multiplexed into a first seventh conductive portion; an active layer of the third node control transistor includes the first seventh conductive portion, a seventh channel portion, and a second seventh conductive portion sequentially arranged along the first direction; a gate electrode of the fourth node control transistor is coupled to a gate electrode of the first node control transistor, and a second electrode of the fourth node control transistor is coupled to a gate electrode of the output reset transistor; a gate electrode of the third node control transistor is coupled to a first electrode plate of the first capacitor, and a first electrode of the third node control transistor is coupled to a gate electrode of the first node control transistor; the second sixth conductive portion is used as a second electrode of the third node control transistor and a first electrode of the fourth node control transistor; the first electrode of the fourth node control transistor is coupled to a second electrode plate of the first capacitor.

In some embodiments of the present disclosure, an orthographic projection of the second electrode plate of the first capacitor on the base substrate is within an orthographic projection of the first electrode plate of the first capacitor on the base substrate; the orthographic projection of the second electrode plate of the first capacitor on the base substrate partially overlaps an orthographic projection of the first voltage signal line on the substrate; the third node control transistor and the fourth node control transistor are located on a side of the first capacitor away from the display area.

In some embodiments of the present disclosure, the at least one shift register unit further comprises a fifth node control circuit, and the fifth node control circuit comprises a fifth node control transistor; the fifth node control transistor includes a second active pattern, and the second active pattern is a U-shaped structure; the second active pattern includes a first fifth node control channel portion, a second fifth node control channel portion, a first fifth node control conductive portion coupled to the first fifth node control channel portion, and a second fifth node control conductive portion coupled to the second fifth node control channel portion; a gate electrode of the fifth node control transistor includes a first gate pattern and a second gate pattern that are coupled to each other; the first gate pattern corresponds to the first fifth node control channel portion, and the second gate pattern corresponds to the second fifth node control channel portion; the first fifth node control conductive portion serves as a second electrode of the fifth node control transistor, and the second fifth node control conductive portion serves as a first electrode of the fifth node control transistor.

In some embodiments of the present disclosure, the at least one shift register unit further comprises a fifth node control circuit, and the fifth node control circuit comprises a sixth node control transistor; the sixth node control transistor includes a third active pattern, and the third active pattern extends along a first direction.

In some embodiments of the present disclosure, the scan driving circuit further comprises a fourth voltage signal line, the fourth voltage signal line is configured to provide a first voltage; the first energy storage circuit includes an output capacitor; an orthographic projection of a second electrode plate of the output capacitor on the base substrate is within an orthographic projection of a first electrode plate of the output capacitor on the base substrate; the orthographic projection of the second electrode plate of the output capacitor on the base substrate partially overlaps an orthographic projection of the fourth voltage signal line on the base substrate; a width of the second electrode plate of the output capacitor along the second direction is smaller than a first predetermined width, and a length of the second electrode plate of the output capacitor along the first direction is greater than a first predetermined length; the fourth voltage signal line extends along the first direction.

In some embodiments of the present disclosure, the first predetermined width is 20 microns and the first predetermined length is 22 microns.

In some embodiments of the present disclosure, the first energy storage circuit includes an output capacitor; the at least one shift register unit further includes a fifth node control circuit, and the fifth node control circuit includes a fifth node control transistor and a sixth node control transistor; the fifth node control transistor and the sixth node control transistor are located between the third voltage signal line and the fourth voltage signal line; a first electrode of the sixth node control transistor is coupled to a fourth voltage signal line, and a second electrode of the sixth node control transistor is coupled to a second electrode of the fifth node control transistor; a first electrode of the fifth node control transistor is coupled to a gate electrode of the sixth node control transistor; an orthographic projection of a second electrode plate of the output capacitor on the base substrate is within an orthographic projection of a first electrode plate of the output capacitor on the base substrate; the orthographic projection of the second electrode plate of the output capacitor on the base substrate partially overlaps an orthographic projection of the fourth voltage signal line on the base substrate; the first electrode plate of the output capacitor is coupled to a gate electrode of the fifth node control transistor; the third voltage signal line and the fourth voltage signal line extend along the first direction.

In some embodiments of the present disclosure, the scan driving circuit further comprises a first clock signal line and a second clock signal line that are arranged on a side of the fourth voltage signal line away from the display area; the second electrode plate of the output capacitor is coupled to the first clock signal line; a gate electrode of the sixth node control transistor is coupled to the second clock signal line; both the first clock signal line and the second clock signal line extend along a first direction.

In some embodiments of the present disclosure, the scan driving circuit further comprises a third voltage signal line, a fourth voltage signal line, a first clock signal line, and a second clock signal line; the output circuit includes an output transistor and an output reset transistor; the first leakage prevention circuit includes a first control transistor; the at least one shift register unit further includes a signal output line, a second control transistor, an input transistor, a first node control transistor, a second node control transistor, a third node control transistor, a fourth node control transistor, a fifth node control transistor, a sixth node control transistor, and a reset control transistor; the reset control transistor, the output transistor and the output reset transistor are arranged between the first voltage signal line and the second voltage signal line; the first control transistor, the second control transistor, the input transistor, the first node control transistor, the second node control transistor, the third node control transistor, and the fourth node control transistor are located between the first voltage signal line and the third voltage signal line; the fifth node control transistor and the sixth node control transistor are located between the third voltage signal line and the fourth voltage signal line; the signal output line includes a first output line portion and a second output line portion; the first output line portion is located between the output circuit and the second voltage signal line; the first output line portion is coupled to the second output line portion, the first output line portion extends along a first direction, and the second output line portion extends along a second direction, the first direction intersects the second direction; the second output line portion extends to the display area.

In some embodiments of the present disclosure, the first energy storage circuit includes an output capacitor and an output reset capacitor; the at least one shift register unit further includes a first capacitor; an orthographic projection of a second electrode plate of the first capacitor on the base substrate partially overlaps the orthographic projection of the first voltage signal line on the base substrate, or the first capacitor is located between the first voltage signal line and the fourth node control transistor; the orthographic projection of the second electrode plate of the first capacitor on the base substrate is within an orthographic projection of a first electrode plate of the first capacitor on the base substrate; an orthographic projection of a second electrode plate of the output reset capacitor on the base substrate is within an orthographic projection of a first electrode plate of the output reset capacitor on the base substrate; the orthographic projection of the second electrode plate of the output reset capacitor on the base substrate partially overlaps the orthographic projection of the second voltage signal line on the base substrate; an orthographic projection of a second electrode plate of the output capacitor on the base substrate is within an orthographic projection of a first electrode plate of the output capacitor on the base substrate; an orthographic projection of the second electrode plate of the output capacitor on the substrate partially overlaps an orthographic projection of the fourth voltage signal line on the base substrate.

In a second aspect, a method for manufacturing a display substrate, includes forming a first voltage signal line, a second voltage signal line, and a scan driving circuit on a base substrate; wherein the scan driving circuit includes a plurality of shift register units, and at least one shift register unit of the plurality of shift register units includes an output circuit, a first energy storage circuit and a first leakage prevention circuit, the output circuit is respectively coupled to the first voltage signal line and the second voltage signal line, the first energy storage circuit is respectively coupled to the output circuit and the second voltage signal line, and the first leakage prevention circuit is coupled to the output circuit; wherein the method for manufacturing the display substrate further includes: forming the first voltage signal line on a side of the second voltage signal line away from the display area; forming the output circuit between the first voltage signal line and the second voltage signal line; setting an orthographic projection of the first energy storage circuit on the base substrate to partially overlap an orthographic projection of the second voltage signal line on the base substrate; forming the first leakage prevention circuit on a side of the first voltage signal line away from the second voltage signal line; wherein the first voltage signal line is configured to provide a first voltage, and the second voltage signal line is configured to provide a second voltage.

In a third aspect, a display device includes the display substrate.

DETAILED DESCRIPTION

The technical solutions in the embodiments of the present disclosure will be clearly and completely described below in conjunction with the accompanying drawings in the embodiments of the present disclosure. Obviously, the described embodiments are only a portion of the embodiments of the present disclosure, rather than all the embodiments. Based on the embodiments in the present disclosure, all other embodiments obtained by those of ordinary skill in the art without creative work fall within the protection scope of the present disclosure.

The display substrate according to at least one embodiment of the present disclosure includes a scan driving circuit disposed on a base substrate, and the scan driving circuit includes a plurality of shift register units.

Figure 1:
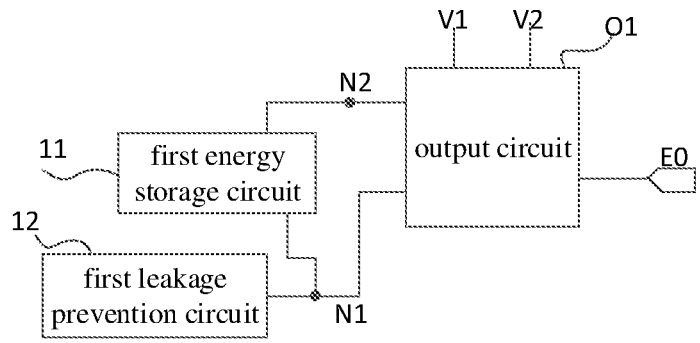
FIG. 1 is a structural diagram of at least one shift register unit in a display substrate according to an embodiment of the present disclosure.

As shown in FIG. 1, at least one shift register unit in a display substrate according to an embodiment of the present disclosure may include a signal output line E0, an output circuit O1, a first energy storage circuit 11, and a first leakage prevention circuit 12.

The output circuit O1 is used to control to apply the first voltage V1 to the signal output line E0 under the control of a potential of the first node N1, and to control to apply the first voltage V1 to the signal output line under the control of a potential of the second node N2.

The first energy storage circuit 11 is respectively coupled to the first node N1 and the second node N2 for storing electric energy.

The first leakage prevention circuit 12 is coupled to the first node N1, and is used to control the absolute value of the change of the potential of the first node N1 to be smaller than a predetermined voltage change amount when the potential of the first node N1 changes.

In the embodiment of the present disclosure, when the shift register unit is in operation, the first leakage prevention circuit 12 can be used to control the absolute value of the change of the potential of the first node N1 to be smaller than the first predetermined voltage change amount when the potential of the first node N1 changes, so as to prevent the change of the potential of the first node N1 from being too large to cause current leakage of the output transistor included in the output circuit O1, resulting in an output error.

Optionally, the first predetermined voltage change amount may be 1V, but is not limited to this.

In specific implementation, the first voltage may be a low voltage VL, but is not limited to this.

Optionally, the first leakage prevention circuit may include a first control transistor.

A gate electrode of the first control transistor is coupled to a first control voltage terminal, a first electrode of the first control transistor is coupled to the first node, and a second electrode of the first control transistor is coupled to the third node.

The first control voltage terminal is used to provide a first control voltage to control the first control transistor to be turned on.

In at least one embodiment of the present disclosure, the first control voltage may be a low voltage VL, but it is not limited.

Figure 2:
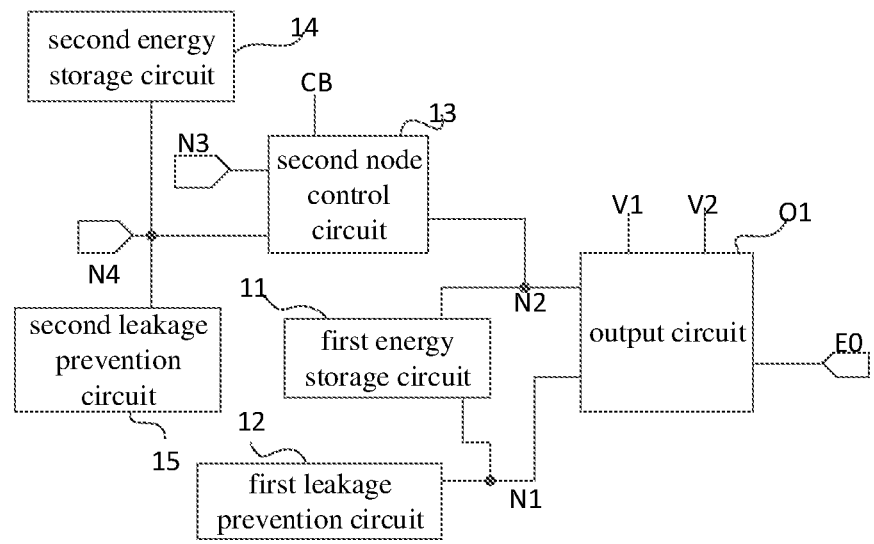
FIG. 2 is a structural diagram of the shift register unit according to at least one embodiment of the present disclosure.

In specific implementation, on the basis of the shift register unit shown in FIG. 1, as shown in FIG. 2, the shift register unit may further include a second node control circuit 13, a second energy storage circuit 14 and a second leakage prevention circuit 15.

The second node control circuit 13 is respectively coupled to a first clock signal line CB, a fourth node N4, a second node N2, and a third node N3, and configured to control the potential of the second node N2 under the control of the first clock signal applied by the first clock signal line CB and the potential of the fourth node N4, and control to apply the second voltage to the second node N2 under the control of the potential of the third node N3.

The second energy storage circuit 14 is coupled to the fourth node N4 for storing electric energy.

The second leakage prevention circuit 15 is coupled to the fourth node N4, and is used to control the absolute value of the change of the potential of the fourth node N4 to be smaller than a second predetermined voltage change amount when the potential of the fourth node N4 changes.

Optionally, the second predetermined voltage change amount may be 1V, but is not limited to this.

In specific implementation, the second voltage may be a high voltage Vh, but is not limited to this.

In the shift register unit as shown in FIG. 2, the second leakage prevention circuit 15 is used to control the absolute value of the change of the potential of the fourth node N4 to be less than the first predetermined voltage change amount when the potential of the fourth node N4 changes, so as to prevent the change of the potential of the fourth node N4 from being too large to cause current leakage of the transistor which is included in the shift register unit and has a gate electrode coupled to the fourth node N4.

Optionally, the second leakage prevention circuit may include a second control transistor.

A gate electrode of the second control transistor is coupled to the second control voltage terminal, a first electrode of the second control transistor is coupled to the fourth node, and a second electrode of the second control transistor is coupled to the fifth node.

The second control voltage terminal is used to provide a second control voltage to control the second control transistor to be turned on.

In at least one embodiment of the present disclosure, the second control voltage may be a low voltage VL, but is not limited to this.

In a preferred case, the shift register unit has a one-to-one correspondence with a row of pixel circuits arranged in the display area;

The shift register unit is coupled to the light emitting control terminal of the row of pixel circuits, and is used to provide a light emitting control signal for the light emitting control terminal of the row of pixel circuits.

In at least one embodiment of the present disclosure, one stage of shift register unit is used to provide a light emitting control signal to one row of pixel circuits, which can realize pulse width modulation (PWM) fine dimming under low grayscale display conditions, and achieve a better display screen and effect, reduce the low grayscale Mura (unevenness) of the screen.

In at least one embodiment of the present disclosure, the output circuit may include an output transistor and an output reset transistor.

A gate electrode of the output transistor is coupled to the first node, a first voltage is applied on a first electrode of the output transistor, and a second electrode of the output transistor is coupled to the signal output line.

A gate electrode of the output reset transistor is coupled to the second node, a second voltage is applied on a first electrode of the output reset transistor, and a second electrode of the output reset transistor is coupled to the signal output line.

The first energy storage circuit may include an output reset capacitor and an output capacitor.

A first electrode plate of the output capacitor is coupled to the first node, and a second electrode plate of the output capacitor is coupled to the first clock signal line.

A first electrode plate of the output reset capacitor is coupled to the second node, and a second electrode plate of the output reset capacitor is connected to a second voltage.

Figure 3:
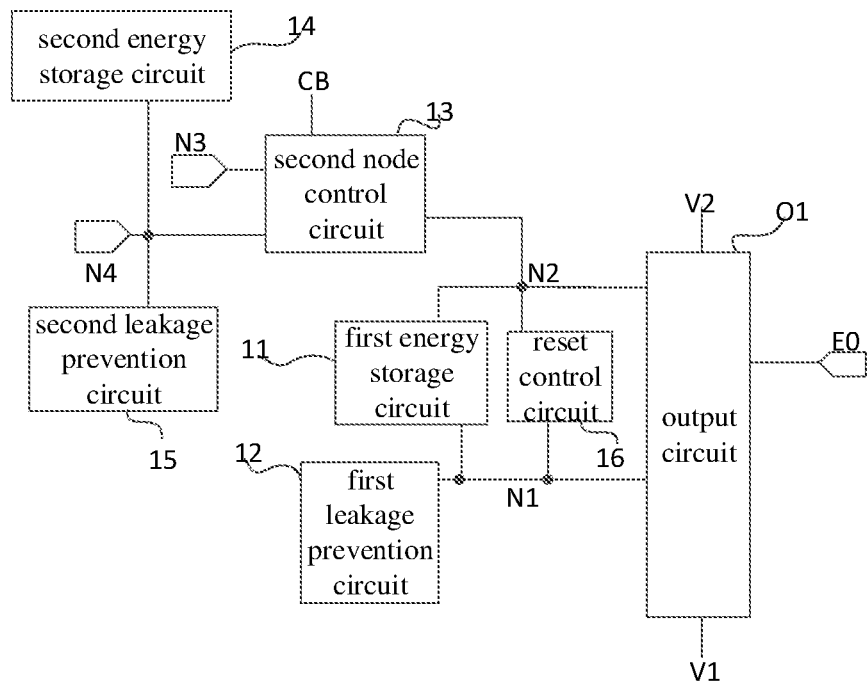
FIG. 3 is a structural diagram of the shift register unit according to at least one embodiment of the present disclosure.

In specific implementation, as shown in FIG. 3, on the basis of the shift register unit shown in FIG. 2, the shift register unit may further include a reset control circuit 16.

The reset control circuit 16 is respectively coupled to the first node N1 and the second node N2, and is used to control to apply the second voltage to the second node N2 under the control of the potential of the first node N1.

In at least one embodiment of the present disclosure, the shift register unit adopts the reset control circuit 16 to control to apply the second voltage to the second node N2 when the output transistor included in the output circuit for controlling the potential of the first node N1 is turned on, so as to control the output reset transistor included in the output circuit to be turned off.

Optionally, the reset control circuit may include a reset control transistor.

A gate electrode of the reset control transistor is coupled to the first node, a second voltage is applied to a first electrode of the reset control transistor, and the second electrode of the reset control transistor is coupled to the second node.

Figure 4:
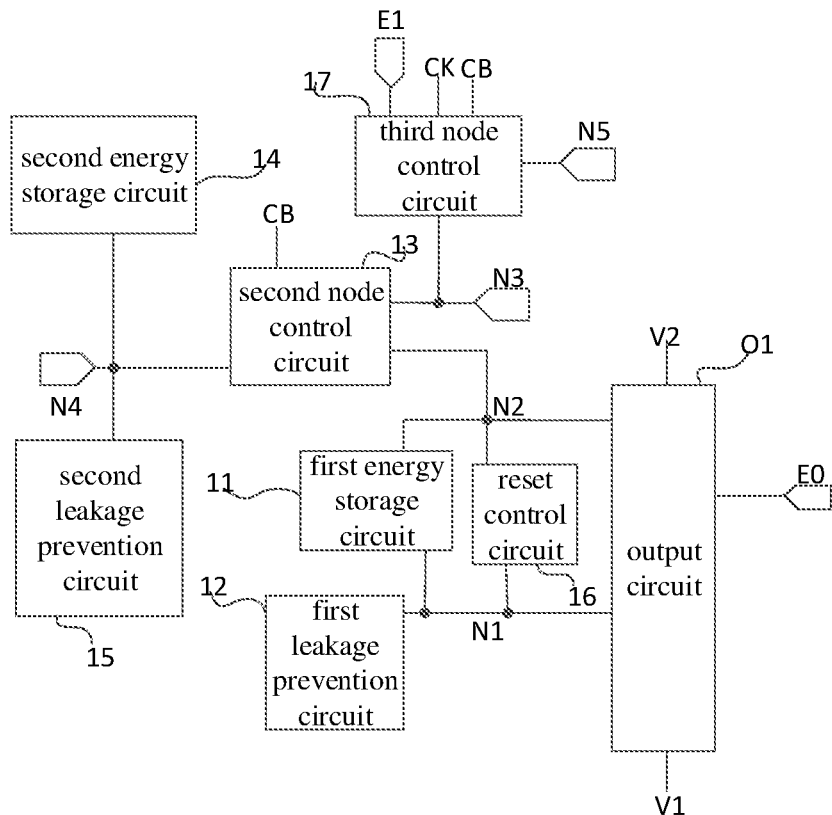
FIG. 4 is a structural diagram of the shift register unit according to at least one embodiment of the present disclosure.

In specific implementation, as shown in FIG. 4, based on the shift register unit shown in FIG. 3, the shift register unit may further include a third node control circuit 17.

The third node control circuit 17 is respectively coupled to an input terminal E1, a second clock signal line CK, a third node N3, a fifth node N5, and a first clock signal line CB, and is used to control the input terminal E1 to be connected to the third node N3 under the control of the second clock signal applied by the second clock signal line CK, and control to apply the second voltage to the third node N3 under the control of the potential of the fifth node N5 and the first clock signal provided by the first clock signal line CB.

The first clock signal line CB is used to provide the first clock signal, and the second clock signal line CK is used to provide the second clock signal.

In at least one embodiment of the present disclosure, the shift register unit may further include a third node control circuit 17 for controlling the potential of the third node N3.

Optionally, the third node control circuit may include an input transistor, a first node control transistor, and a second node control transistor.

A gate electrode of the input transistor is coupled to a second clock signal line, a first electrode of the input transistor is coupled to the input terminal, and a second electrode of the input transistor is coupled to the third node.

A gate electrode of the second node control transistor is coupled to the fifth node, and a second voltage is applied to a first electrode of the second node control transistor.

A gate electrode of the first node control transistor is coupled to the first clock signal line, a first electrode of the first node control transistor is coupled to the second electrode of the second node control transistor, and a second electrode of the first node control transistor is coupled to the third node.

Figure 5:
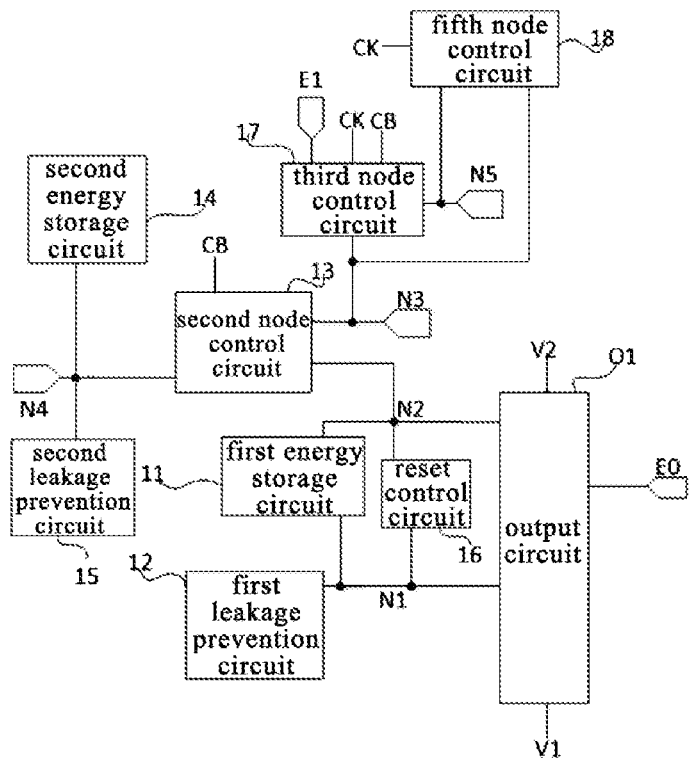
FIG. 5 is a structural diagram of the shift register unit according to at least one embodiment of the present disclosure.

In at least one embodiment of the present disclosure, as shown in FIG. 5, on the basis of the shift register unit shown in FIG. 4, the shift register unit may further include a fifth node control circuit 18.

The fifth node control circuit 18 is respectively coupled to the second clock signal line CK, the fifth node N5, and the third node N3, is configured to control apply the first voltage to the fifth node N5 under the control of the second clock signal, and control the fifth node N5 to be connected to the second clock signal line CK under the control of the potential of the third node N3.

The second clock signal line CK is used to provide the second clock signal.

In at least one embodiment of the present disclosure, the shift register unit may use the fifth node control circuit 18 to control the potential of the fifth node N5.

Optionally, the second node control circuit may include a third node control transistor and a fourth node control transistor; the second energy storage circuit includes a first capacitor.

A gate electrode of the third node control transistor is coupled to the fourth node, and a first electrode of the third node control transistor is coupled to the first clock signal line.

A gate electrode of the fourth node control transistor is coupled to the first clock signal line, the first electrode of the fourth node control transistor is coupled to the second electrode of the third node control transistor, and the second electrode of the fourth node control transistor is coupled to the second node.

A first electrode plate of the first capacitor is coupled to the fourth node, and a second electrode plate of the first capacitor is coupled to the second electrode of the third node control transistor.

Optionally, the fifth node control circuit may include a fifth node control transistor and a sixth node control transistor.

A gate electrode of the fifth node control transistor is coupled to the third node, a first electrode of the fifth node control transistor is coupled to the second clock signal line, and a second electrode of the fifth node control transistor is coupled to the fifth node.

A gate electrode of the sixth node control transistor is coupled to the second clock signal line, the first voltage is applied to a first electrode of the sixth node control transistor, and a second electrode of the sixth node control transistor is coupled to the fifth node.

Figure 6:
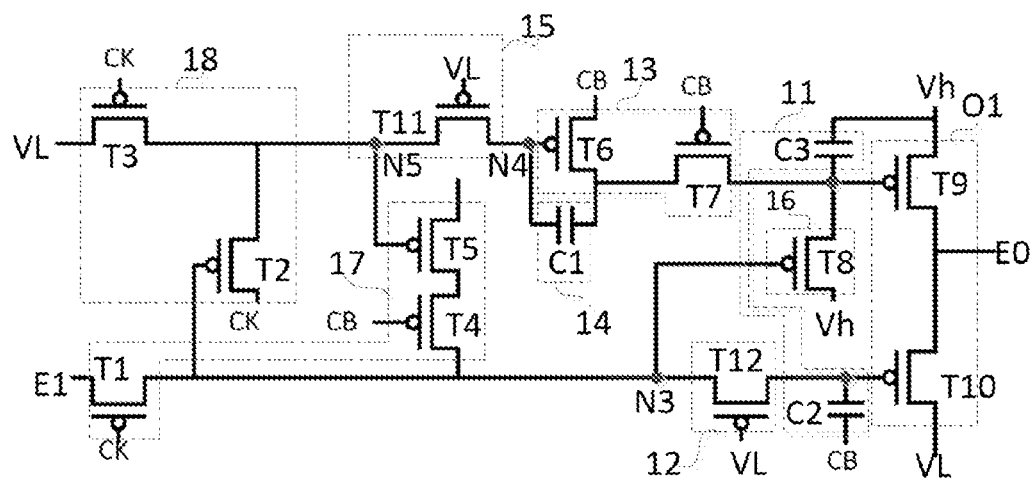
FIG. 6 is a structural diagram of the shift register unit according to an embodiment of the present disclosure.

As shown in FIG. 6, the shift register unit may include a signal output line E0, an output circuit O1, a first energy storage circuit 11, a first leakage prevention circuit 12, a second node control circuit 13, a second energy storage circuit 14, a second leakage prevention circuit 15, a reset control circuit 16, a third node control circuit 17, and a fifth node control circuit 18.

The first leakage prevention circuit 12 includes a first control transistor T12.

The low voltage VL is applied to the gate electrode of the first control transistor T12, the first electrode of the first control transistor T12 is coupled to the first node N1, and the second electrode of the first control transistor T12 is connected to the third node N3.

The second leakage prevention circuit 15 includes a second control transistor T11.

The low voltage VL is applied to the gate electrode of the second control transistor T11, the first electrode of the second control transistor T11 is coupled to the fourth node N4, and the second electrode of the second control transistor T11 is connected to the fifth node N5.

The output circuit O1 includes an output transistor T10 and an output reset transistor T9.

The gate electrode of the output transistor T10 is coupled to the first node N1, the low voltage VL is applied to the first electrode of the output transistor T10, and the second electrode of the output transistor T10 is coupled to the signal output line E0.

The gate electrode of the output reset transistor T9 is coupled to the second node N2, the high voltage Vh is applied to the first electrode of the output reset transistor T9, and the second electrode of the output reset transistor T9 is connected to the signal output line E0.

The first energy storage circuit 11 includes an output reset capacitor C3 and an output capacitor C2.

The first electrode plate of the output capacitor C2 is coupled to the first node N1, and the second electrode plate of the output capacitor C2 is coupled to the first clock signal line CB.

The first electrode plate of the output reset capacitor C3 is coupled to the second node N2, and the high voltage Vh is applied to the second electrode plate of the output reset capacitor C3.

The reset control circuit 16 includes a reset control transistor T8.

The gate electrode of the reset control transistor T8 is coupled to the first node N1, the high voltage Vh is applied to the first electrode of the reset control transistor T8, and the second electrode of the reset control transistor T8 is connected to the second node N2.

The third node control circuit 17 includes an input transistor T1, a first node control transistor T4, and a second node control transistor T5.

The gate electrode of the input transistor T1 is coupled to the second clock signal line CK, the first electrode of the input transistor T1 is coupled to the input terminal E1, and the second electrode of the input transistor T1 is coupled to the third Node N3.

The gate electrode of the second node control transistor T5 is coupled to the fifth node N5, and the high voltage Vh is applied to the first electrode of the second node control transistor T5.

The gate electrode of the first node control transistor T4 is coupled to the first clock signal line CB, and the first electrode of the first node control transistor T4 is coupled to the second electrode of the second node control transistor T5, the second electrode of the first node control transistor T4 is coupled to the third node N3.

The second node control circuit 13 includes a third node control transistor T6 and a fourth node control transistor T7. The second energy storage circuit 14 includes a first capacitor C1.

The gate electrode of the third node control transistor T6 is coupled to the fourth node N4, and the first electrode of the third node control transistor T6 is coupled to the first clock signal line CB.

The gate electrode of the fourth node control transistor T7 is coupled to the first clock signal line CB, and the first electrode of the fourth node control transistor T7 is coupled to the second electrode of the third node control transistor T6, the second electrode of the fourth node control transistor T7 is coupled to the second node N2.

The first electrode plate of the first capacitor C1 is coupled to the fourth node N4, and the second electrode plate of the first capacitor C1 is coupled to the second electrode of the third node control transistor T6.

The fifth node control circuit 18 includes a fifth node control transistor T2 and a sixth node control transistor T3.

The gate electrode of the fifth node control transistor T2 is coupled to the third node N3, the first electrode of the fifth node control transistor T2 is coupled to the second clock signal line CK, and the second electrode of the fifth node control transistor T2 is coupled to the fifth node N5.

The gate electrode of the sixth node control transistor T3 is coupled to the second clock signal line CK, a low voltage VL is applied to the first electrode of the sixth node control transistor T3, and the second electrode of the sixth node control transistor T3 is coupled to the fifth node N5.

In the embodiment of the shift register unit shown in FIG. 6, the first control voltage terminal and the second control voltage terminal provide a low voltage VL, the first voltage is the low voltage VL, and the second voltage is a high voltage Vh, but not limited to this.

In the shift register unit shown in FIG. 6, all the transistors are p-type transistors, but not limited to this.

In the embodiment of the present disclosure, the shift register unit shown in FIG. 6 may be the shift register unit in the light emitting control scan driving circuit, but is not limited to this.

Figure 7:
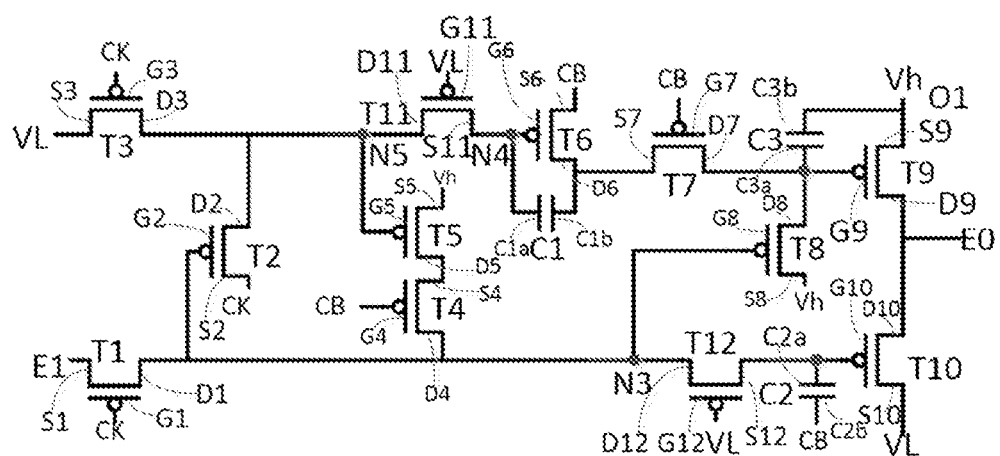
FIG. 7 is a schematic diagram showing gate electrodes, first electrodes, and second electrodes of transistors, and first electrode plates and second electrode plates of capacitors on the basis of FIG. 6.

FIG. 7 shows the first electrode of each transistor, the second electrode of each transistor, the gate electrode of each transistor, the first electrode plate of each capacitor, and the second electrode plate of each capacitor on the basis of FIG. 6.

In FIG. 7, the gate electrode marked G1 is the gate electrode of T1, the first electrode marked S1 is the first electrode of T1, and the second electrode marked D1 is the second electrode of T1; the gate electrode marked G2 is the gate electrode of T2, the first electrode marked S2 is the first electrode of T2, the second electrode marked D2 is the second electrode of T2; the gate electrode marked G3 is the gate electrode of T3, the first electrode marked S3 is the first electrode of T3, and the second electrode marked D3 is the second electrode of T3; the gate electrode marked G4 is the gate electrode of T4, the first electrode marked S4 is the first electrode of T4, the second electrode marked D4 is the second electrode of T4; the gate electrode marked G5 is the gate electrode of T5, the first electrode marked S5 is the first electrode of T5, and the second electrode marked D5 is the second electrode of T5; the gate electrode marked G6 is the gate electrode of T6, the first electrode marked S6 is the first electrode of T6, the second electrode marked D6 is the second electrode of T6; the gate electrode marked G7 is the gate electrode of T7, the first electrode marked S7 is the first electrode of T7, and the second electrode marked D7 is the second electrode of T7; the gate electrode marked G8 is the gate electrode of T8, the first electrode marked S8 is the first electrode of T8, the second electrode marked D8 is the second electrode of T8; the gate electrode marked G9 is the gate electrode of T9, the first electrode marked S9 is the first electrode of T9, and the second electrode marked D9 is the second electrode of T9; the gate electrode marked G10 is the gate electrode of T10, the first electrode marked S10 is the first electrode of T10, the second electrode marked D10 is the second electrode of T10; the gate electrode marked G11 is the gate electrode of T11, the first electrode marked S11 is the first electrode of T11, and the second electrode marked D11 is the second electrode of T11; the gate electrode marked G12 is the gate electrode of T12, the first electrode marked S12 is the first electrode of T12, the second electrode marked D12 is the second electrode of T12; C1a is the first electrode plate of C1, C1b is the second electrode plate of C1; C2a is the first electrode plate of C2, and C2b is the second electrode plate of C2; C3a is the first electrode plate of C3, C3b is the second electrode plate of C3.

In at least one embodiment of the present disclosure, the first electrode of the transistor may be a source electrode, and the second electrode of the transistor may be a drain electrode; or, the first electrode of the transistor may be a drain electrode, and the second electrode of the transistor may be a source electrode.

Figure 8:
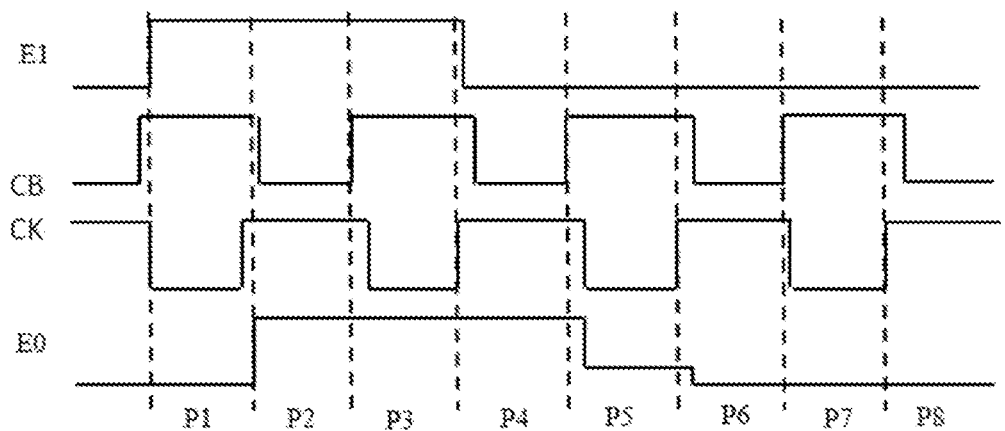
FIG. 8 is a working timing diagram of the shift register unit shown in FIG. 6.

As shown in FIG. 8, the shift register unit shown in FIG. 6 of the present disclosure is in operation.

In the first time period P1, E1 provides a high level, CK provides a low level, T1, T3, T11 and T12 are turned on, the potential of N3 is high, T2 is turned off, the potential of N5 is low, T4, T8 and T10 are turned off, T5 and T6 are turned on; at this time, the potential of the first electrode of the fourth node control transistor T7 is high, CB is high, and T7 is turned off; since the voltage across the capacitor will not change suddenly, the potential of N2 is maintained at the high level of the previous frame, T9 is turned off, and the potential of the light emitting control signal outputted by E0 is maintained at the low level of the previous frame.

In the second time period P2, E1 and CK provide a high level, CB provides a low level, T1, T2 and T3 are turned off, the potential of N5 remains at a low level, T4, T5 and T6 are turned on, and the potential of N3 is high, the potential of the first electrode of the fourth node control transistor T7 changes from high to low, T7 is turned on, T8 is turned off, the potential of N2 is low, T9 is turned on, and E0 outputs a high level; T12 is turned on, T10 is turned off In the third time period P3, E1 and CB all provide a high level, CK provides a low level, T1 and T3 are turned on, the potential of N3 is high, the potential of N5 is low, T2 and T4 are turned off, and T5 and T6 are turned on, the potential of the first electrode of the fourth node control transistor T7 is changed from the low level in the previous time period to a high level, T7 is turned off, the potential of N2 is maintained at a low level due to the discharge of C3, and T9 is turned on, E0 outputs a high level; T12 is turned on, T8 and T10 are turned off.

In the fourth time period P4, E1 and CB provide a low level, CK provides a high level, T1 and T3 are turned off, the potential of N3 is high, T2 is turned off, and the potential of N5 is maintained at a low level, T11, T4, T5 and T6 are turned on, the potential of the first electrode of the fourth node control transistor T7 is changed to a low level, T7 is turned on, the potential of N2 is low, T9 is turned on, E0 outputs a high level, and T12 is turned on, T8 and T10 are turned off.

In the fifth time period P5, E1 and CK provide a low level, CB provides a high level, T1, T2, T3, T11, and T12 are all turned on, the potential of N3 and the potential of N5 are both low, T4 is turned off, T5 and T6 are turned on, the potential of the first electrode of the fourth node control transistor T7 is changed to high, T7 is turned off, T8 is turned on, the potential of N2 is changed to high, T9 is turned off, T10 is turned on, and E0 outputs a low level.

In the sixth time period P6, both E1 and CB provide a low level, CK provides a high level, T1 and T3 are turned off, the potential of N3 is maintained at a low level, T2 is turned on, and the potential of N5 is at high level, T11, T12, T4 and T5 are turned on, T6 is turned off, the potential of the first electrode of the fourth node control transistor T7 is high, T7 and T8 are turned on, the potential of N2 is high, T9 is turned off, T10 is turned on, and E0 outputs a low level.

In the seventh time period P7, both E1 and CK provide a low level, CB provides a high level, T1, T2, T3, T11, T12 and T5 are all turned on, the potential of N3 and the potential of N5 are low, and T4 is turned off, T5 and T6 are turned on, the potential of the first electrode of the fourth node control transistor T7 is high, T7 is turned off, T8 is turned on, node N4 is high, T9 is turned off, T10 is turned on, and E0 outputs a low level.

In the eighth time period P8, both E1 and CB provide a low level, CK provides a high level, T1 and T3 are turned off, the potential of N3 is maintained at a low level, T2 is turned on, the potential of N5 is high, and T4 is turned on. T5 and T6 are turned off, the potential of the first electrode of the fourth node control transistor T7 is maintained at a high level, T11, T12, T7 and T8 are turned on, the potential of N2 is at a high level, T9 is turned off, T10 is turned on, and E0 outputs a low level.

After the seventh time period P7, T8 continues to be turned on, T9 is turned off, T1 periodically charges C2, the potential of N3 remains low, and T10 continues to be turned on, so that E0 outputs the low level until the next frame of input signal pulse starts.

In at least one embodiment of the present disclosure, the scan driving circuit includes a plurality of stages of the above-mentioned shift register units.

In specific implementation, the scan driving circuit is usually designed to be arranged on both sides of the pixel circuit in the display area. The scan driving circuit includes a lot of capacitors, thin film transistors, and signal lines, which occupy a lot of space. Therefore, it is necessary to rationally design the placement position of the device and the common signal wiring to reduce the space occupied by the scan driving circuit and facilitate the narrowing of the display frame.

Figure 9:
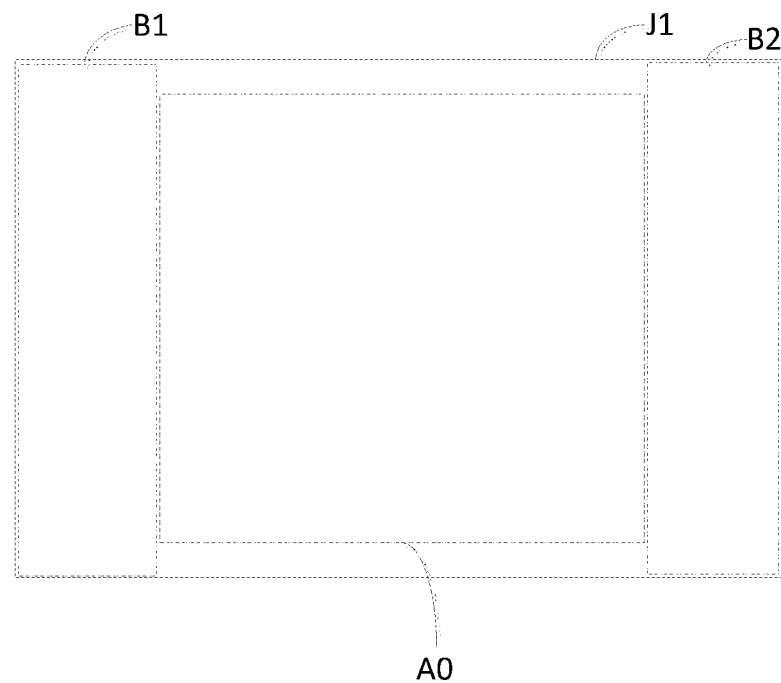
FIG. 9 is a schematic diagram showing area division of a display substrate according to at least one embodiment of the present disclosure.

As shown in FIG. 9, the label J1 is the display substrate, the label A0 is the display area, the label B1 is the first edge area, and the label B2 is the second edge area.

A plurality of light emitting control lines, a plurality of gate lines, and a plurality of data lines may be provided in the display area A0 of the display substrate J1, and a plurality of sub-pixels are defined by the intersection of the plurality of gate lines and the plurality of data lines.

A scan driving circuit may be provided in the first edge area B1 and/or the second edge area B2, the scan driving circuit includes a plurality of shift register units.

The plurality of shift register units included in the scan driving circuit are in one-to-one correspondence to the plurality of light emitting control lines, and the signal output line of each shift register unit is coupled to the corresponding light emitting control line for providing a light emitting control signal to the corresponding light emitting control line.

In specific implementation, one light emitting control line is coupled to the light emitting control terminal of the pixel circuits in the corresponding row.

Optionally, the display substrate further includes a plurality of rows of pixel circuits arranged on the base substrate; the pixel circuit includes a light emitting control terminal.

The shift register unit included in the scan driving circuit is in one-to-on correspondence to the row of pixel circuits.

The signal output line of the shift register unit is coupled to the light emitting control end of the corresponding row of pixel circuits, and is used to provide the light emitting control signal for the light emitting control end of the corresponding row of pixel circuits.

In at least one embodiment of the present disclosure, the pixel circuit may be disposed in the display area of the display substrate, and the scan driving circuit may be disposed in the edge area of the display substrate.

Figure 10A:
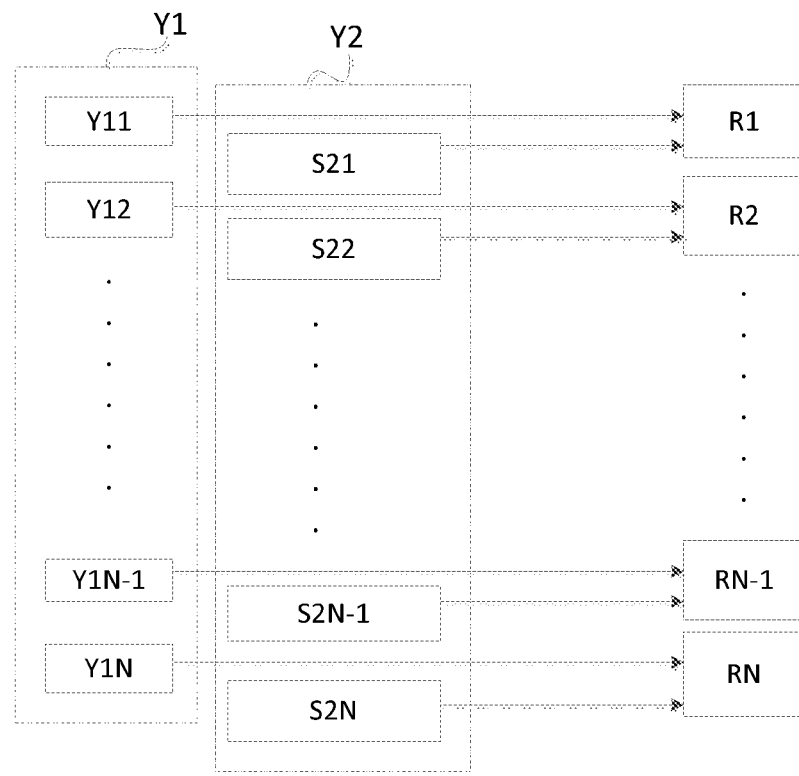
FIG. 10A is a schematic diagram showing the connection relationship between the scan driving circuit and the pixel circuit included in the display substrate according to at least one embodiment of the present disclosure.

As shown in FIG. 10A, Y1 is a scan driving circuit, Y11 is a first stage of shift register unit included in the scan driving circuit Y1, and Y12 is a second stage of shift register unit included in the scan driving circuit Y1, Y1N−1 is the (N−1)th stage of shift register unit included in the scan driving circuit Y1, and Y1N is the Nth stage of shift register unit included in the scan driving circuit Y1, N is an integer greater than 3.

In FIG. 10A, the pixel circuit labeled R1 is the first row of pixel circuits, the pixel circuit labeled R2 is the second row of pixel circuits, the pixel circuit labeled RN-1 is the row N-1 of pixel units, and the pixel circuit labeled RN is row N of pixel circuits.

Y11 corresponds to R1, Y12 corresponds to R2, Y1N-1 corresponds to RN-1, and YIN corresponds to RN.

Y11 provides R1 with the first row light emitting control signal, Y12 provides R2 with the second row light emitting control signal, Y1N-1 provides R1N-1 with the (N-1)th row light emitting control signal, and YIN provides R1N with the Nth row light emitting control signal.

As shown in FIG. 10A, in the edge area, the display substrate may further include a gate driving circuit, the gate driving circuit includes a plurality of stages of gate driving units, and the gate driving units are also in one-to-one correspondence to and the pixel rows, and configured to provide a corresponding gate driving signal for a corresponding row of pixels.

In FIG. 10A, Y2 is the gate driving circuit, S21 is the first row of gate driving units included in the gate driving circuit, and S22 is the second row of gate driving units included in the gate driving circuit, S2N-1 is the (N-1)th row of gate driving units included in the gate driving circuit, and S2N is the Nth row of gate driving units included in the gate driving circuit.

In specific implementation, the layout of each transistor, each capacitor, and each signal line in the shift register unit can be adjusted to reduce the occupied area of the shift register unit, thereby reducing the frame width of the display substrate.

Figure 10B:
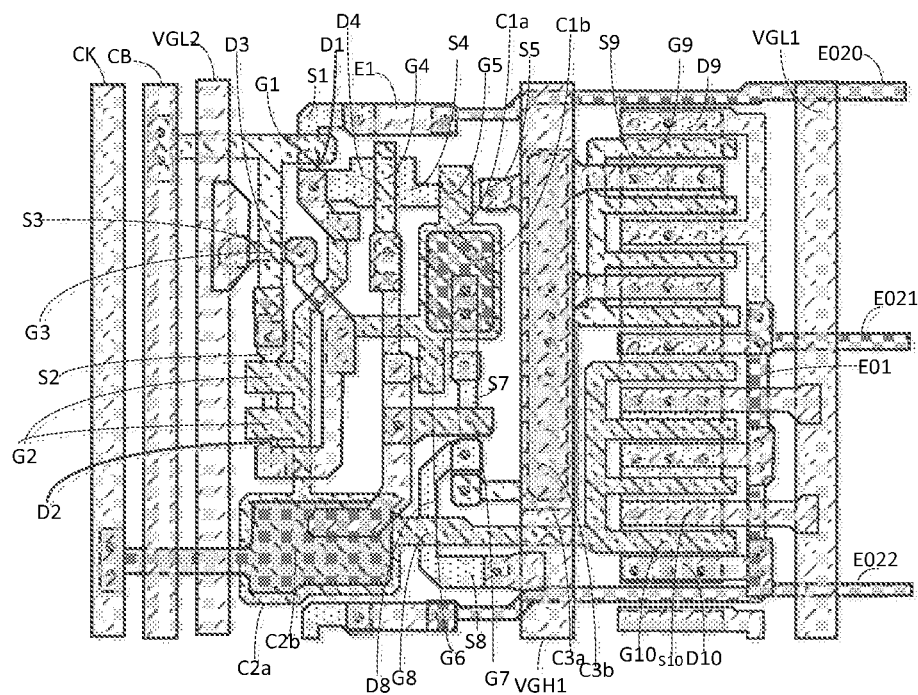
FIG. 10B is a schematic diagram showing a layout of a display substrate according to at least one embodiment of the present disclosure.

In the layout shown in FIG. 10B, the shift register unit includes an output transistor T10, an output reset transistor T9, an output reset capacitor C3, an output capacitor C2, a reset control transistor T8, an input transistor T1, a first node control transistor T4, a second node control transistor T5, a third node control transistor T6, a fourth node control transistor T7, a first capacitor C1, a fifth node control transistor T2, and a sixth node control transistor T3.

In FIG. 10B, S4 is multiplexed as D5, D6 is multiplexed as S7, and D7 is multiplexed as D8.

In FIG. 10B, the first voltage signal line is labeled VGL1, the second voltage signal line is labeled VGH1, and the fourth voltage signal line is labeled VGL2; in the layout shown in FIG. 10B, three voltage signal lines are used, T9 and T10 are set between VGL1 and VGH1, and C1, C2, T1, T2, T3, T4, T5, T6, T7 and T8 are set between VGL1 and VGL2.

In FIG. 10B, E01 is the first output line portion included in the signal output line, E021 is a first second output line portion included in the signal output line, and E022 is a second second output line portion included in the signal output line. E020 is the second output line portion included in the signal output line of the adjacent previous stage of shift register unit.

In the layout shown in FIG. 10B, E01 is coupled to E021 and E022, respectively, E01 extends along the first direction, and E021 and E022 extend along the second direction.

Figure 11:
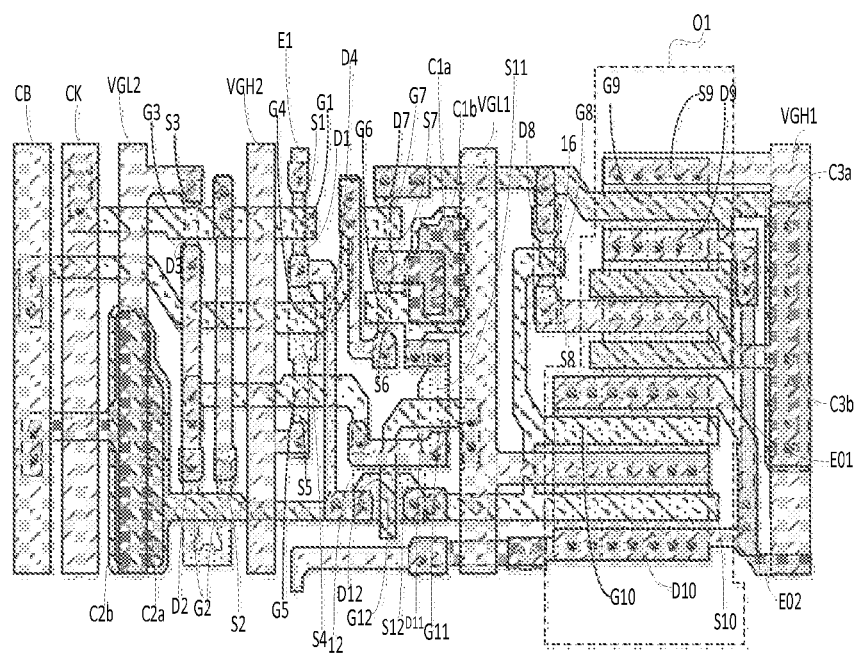
FIG. 11 is a schematic diagram showing another layout of a display substrate according to at least one embodiment of the present disclosure.

In the layout shown in FIG. 11, the first voltage signal line VGL1 is used to provide a low voltage VL, the second voltage signal line VGH is used to provide a high voltage Vh, the third voltage signal line VGH2 is used to provide a high voltage Vh, and the fourth voltage signal line VGL2 is used to provide a low voltage VL.

As shown in FIG. 11, the shift register unit of the above structure is arranged in the edge area of the display substrate, the second voltage signal line VGH1, the first voltage signal line VGL1, the third voltage signal line VGH2 and the fourth voltage signal line VGL2 are arranged in sequence along a direction away from the display area of the display substrate, and the second voltage signal line VGH1, the first voltage signal line VGL1, the third voltage signal line VGH2 and the fourth voltage signal line VGL2 all extend along the first direction;

And, further, on a side of the fourth voltage signal line VGL2 away from the third voltage signal line VGH2, a first clock signal line CB and a second clock signal line CK are provided; the second clock signal line CK, the first clock signal line CB and the start voltage signal line ESTV are sequentially arranged along the direction away from the display area; the first clock signal line CB and the second clock signal line CK both extend along the first direction.

The output transistor T10 and the output reset transistor T9 included in the output circuit, and the reset control transistor T8 included in the reset control circuit are arranged between the first voltage signal line VGL1 and the second voltage signal line VGH1; the output reset transistor T9 and the output transistor T10 are arranged in sequence along the first direction.

T1, T4, T5, T6, T7, T11, and T12 may be arranged between the first voltage signal line VGL1 and the third voltage signal line VGH2.

T2 and T3 may be arranged between the third voltage signal line VGH2 and the fourth voltage signal line VGL2.

An orthographic projection of the second electrode plate C3b of the output reset capacitor C3 on the base substrate partially overlaps an orthographic projection of the second voltage signal line VGH1 on the base substrate, and the orthographic projection of the second electrode plate C3b of the output reset capacitor C3 on the base substrate is within an orthographic projection of the first electrode plate C3a of the output reset capacitor C3 on the base substrate.

The orthographic projection of the second electrode plate C2b of the output capacitor C2 on the base substrate partially overlaps the orthographic projection of the fourth voltage signal line VGL2 on the base substrate, and the orthographic projection of the second electrode plate C2b of the output capacitor C2 on the substrate is within the orthographic projection of the first electrode plate C2a of the output capacitor C2 on the base substrate.

The orthographic projection of the first electrode plate C1a of C1 on the base substrate partially overlaps the orthographic projection of the first voltage signal line VGL1 on the base substrate, and the orthographic projection of the second electrode plate C1b of C1 on the base substrate is within the orthographic projection of the first electrode plate C1a of C1 on the base substrate.

The signal output line includes a first output line portion E01 and a second output line portion E02.

The first output line portion E01 and the second output line portion E02 are coupled to each other.

The first output line portion E01 extends along a first direction, and the first output line portion E01 is located between the second voltage signal line VGH1 and the output circuit O1.

The second output line portion E02 extends along the second direction, and the second output line portion E02 extends to the display area of the display substrate to provide the light emitting control signal to the light emitting control terminal of the corresponding row of pixel circuits.

T1, T4 and T5 are arranged in sequence along the first direction, T7, T6 and T12 are arranged in sequence along the first direction, and C1 and T11 are arranged in sequence along the first direction.

T1, T7 and C1 are arranged in sequence along the second direction.

T3 and T2 are arranged in sequence along the first direction, and the active pattern of T2 is arranged in a U-shaped structure, so that T2 is formed as a double gate structure.

In at least one embodiment of the present disclosure, the first direction intersects the second direction, for example, the first direction may be perpendicular to the second direction, but it is not limited thereto.

Specifically, an angle at which the second direction intersects with the first direction can be set according to actual needs. For example, the second direction is perpendicular to the first direction.

In at least one embodiment of the present disclosure, the position of the first clock signal line CB and the position of the second clock signal line CK can be reversed, but it is not limited to this.

For example, in the layout shown in FIG. 11, the first direction may be a vertical direction from top to bottom, and the second direction may be a horizontal direction from left to right, but is not limited to this.

In actual operation, the width of the signal line mainly affects the resistance, and a wider signal line has less resistance, which is beneficial to signal stability. The first voltage signal line VGL1, the second voltage signal line VGH1, the third voltage signal line VGH2, and the fourth voltage signal line VGL2 provide a direct current voltage, which is less affected by the line width. The first clock signal line CB and the second clock signal line CK provide clock signals. When the potential of the clock signal is converted from a high voltage to a low voltage, the low resistance of the clock signal line makes the potential of the clock signal reach the low voltage faster. Therefore, in at least one embodiment of the present disclosure, the line width of the first clock signal line CB and the line width of the second clock signal line can be set to be wider, but not limited to this.

In the layout shown in FIG. 11 of the present disclosure, since the first electrode S9 of the output reset transistor T9 is coupled to the second voltage signal line VGH1, the first electrode S10 of the output transistor T10 is coupled to the first voltage signal line VGL1, the second electrode D10 of the output transistor T10 and the second electrode D9 of the output reset transistor T9 are both coupled to the first output line portion E01 of the signal output lines included in the at least one shift register unit; the gate electrode G8 of the reset control transistor T8 is coupled to the gate electrode G10 of the output transistor T10, the first electrode S8 of the reset control transistor T8 is coupled to the first electrode S9 of the output reset transistor T9, and the second electrode D8 of the reset control transistor T8 is coupled to the gate electrode G8 of the output reset transistor T9, so T8, T9, T10, and E01 are all set between VGL1 and VGH1, and a width of the active pattern of T9 along the second direction is set to be smaller than the width of the active pattern of T19 along the second direction, and the space between T9 and VGL1 is used to arrange T8, and the active pattern of T8 is set to extend along the first direction, thereby narrowing the width of the shift register unit along the second direction.

In at least one embodiment of the present disclosure, the shift register unit shown in FIG. 11 may be an nth stage of shift register unit included in the scan driving circuit, and n is a positive integer.

In the layout shown in FIG. 11 of the present disclosure, the active layer of T1, the active layer of T4, and the active layer of T5 are formed by a continuous second semiconductor layer, and the second semiconductor layer extends along the first direction. Therefore, the space along the second direction occupied by T1, T4, and T5 can be reduced, which is conducive to achieving a narrow frame; the active layer of T7 and the active layer of T6 are formed by a continuous third semiconductor layer, and the third semiconductor layer extends along the first direction, which can reduce the space along the second direction occupied by T7 and T6, which is beneficial to realize a narrow frame.

In the layout shown in FIG. 11 of the present disclosure, the second electrode D1 of T1 is multiplexed as the second electrode of T4, and the first electrode S1 of T4 is multiplexed as the second electrode of T5.

In the layout shown in FIG. 11 of the present disclosure, the first electrode S1 of T7 is multiplexed as the second electrode of T6.

In the layout shown in FIG. 11 of the present disclosure, C1, T6, and T7 are moved up to use the extra longitudinal space to set T11 and T12 for noise reduction.

In the layout shown in FIG. 11 of the present disclosure, the active pattern of T3 is set to extend along the first direction to save the space occupied by T3 along the second direction.

In the layout shown in FIG. 11 of the present disclosure, the active pattern of T2 is set to a U-shaped structure, so that T2 is formed as a double-gate structure; the purpose of the double-gate structure design is: in the second phase P2, when the shift register unit included in the scan driving circuit outputs the high voltage signal Vgh, T10 should be completely turned off, and the high level applied to the gate electrode of T10 is inputted by the source electrode of T5. Therefore, in the second phase P2, it is necessary to ensure that T5 is turned on, that is, the potential of the fifth node N5 needs to be low; and in the second phase P2, the potential of the gate electrode of T2 is high, to avoid increasing the potential of the second node N2 due to the current leakage of T2, so T2 is set to adopt a double-gate design, which makes it easier to turn off T2.

In actual exposure, if the active pattern of T2 is set to a U-shape without missing corners, metal will be deposited after exposure, which will make the U-shaped active pattern a V-shape. Therefore, in actual products, taking into account the actual exposure process, a small portion of the U-shaped active pattern is dug in two right-angle portions for compensation, and the actual pattern is made to be U-shaped as much as possible, without affecting the width to length ratio of T2.

In addition, in the layout shown in FIG. 11 of the present disclosure, the electrode plates of C3 are set to overlap with VGH1, and the electrode plates of C2 are set to overlap with VGL2 to reduce the space occupied by the shift register unit along the second direction, which is conducive to the realization of narrow frame.

In the layout shown in FIG. 11 of the present disclosure, the orthographic projection of the electrode plates of C1 on the base substrate partially overlap with the orthographic projection of VGL1 on the base substrate, to reduce the space occupied by the shift register unit along the second direction, which is conducive to the realization of narrow frame.

As shown in FIG. 11, the display substrate according to at least one embodiment of the present disclosure includes a scan driving circuit disposed on the base substrate, the scan driving circuit includes a plurality of shift register units, and at least one of the plurality of shift register units is the aforementioned shift register unit; the scan driving circuit further includes a first voltage signal line VGL1 and a second voltage signal line VGH1.

The first voltage signal line VGL1 is located on a side of the second voltage signal line VGL2 away from the display area.

The at least one shift register unit includes an output circuit O1, a first energy storage circuit, and a first leakage prevention circuit 12.

The output circuit O1 is respectively coupled to the first voltage signal line VGL1 and the second voltage signal line VGH1, and the first energy storage circuit is respectively coupled to the output circuit O1 and the second voltage signal line VGH1, the first leakage prevention circuit 12 is coupled to the output circuit O1.

The output circuit O1 is arranged between the first voltage signal line VGL1 and the second voltage signal line VGH1.

The orthographic projection of the first energy storage circuit on the base substrate partially overlaps the orthographic projection of the second voltage signal line VGH1 on the base substrate.

The first leakage prevention circuit 12 is arranged on a side of the first voltage signal line VGL1 away from the second voltage signal line VGH1.

The first voltage signal line VGL1 is used to provide a first voltage, and the second voltage signal line VGH2 is used to provide a second voltage.

In a specific implementation, the first voltage signal line VGL1 and the second voltage signal line VGH1 may extend along a first direction.

As shown in FIGS. 6 and 11-16, the first energy storage circuit may include an output reset capacitor C3 and an output capacitor C2.

Since the output circuit O1 is respectively coupled to the first voltage signal line VGL1 and the second voltage signal line VGH1, in the display substrate according to at least one embodiment of the present disclosure, the output circuit O1 is arranged between the first voltage signal line VGL1 and the second voltage signal line VGH1, so that the length of a connection line between the output circuit O1 and the first voltage signal line VGL1 can be shortened, and the length of a connection line between the output circuit O1 and the second voltage signal line VGH1 can be shortened. Therefore, the output circuit O1, the first voltage signal line VGL1, and the second voltage signal line VGH1 can be arranged properly.

In addition, in the display substrate according to at least one embodiment of the present disclosure, the orthographic projection of the first energy storage circuit on the base substrate partially overlaps with the orthographic projection of the second voltage signal line VGH1 on the base substrate, so as to reduce the width of the shift register unit along the second direction, it is beneficial to realize a narrow frame and facilitate the coupling of the first energy storage circuit and the second voltage signal line VGH1.

In the display substrate according to at least one embodiment of the present disclosure, the at least one shift register unit may include a first leakage prevention circuit 12 to prevent current leakage of the output transistor included in the output circuit O1. In at least one embodiment of the present disclosure, the first leakage prevention circuit 12 is arranged on a side of the first voltage signal line VGL1 away from the second voltage signal line VGH1, so that the first leakage prevention circuit 12 can be easily coupled to the first voltage signal line VGL1. In specific implementation, the second voltage signal line VGH1 may be located on a side of the output circuit O1 close to the display area, and the first voltage signal line VGL1 may be located on a side of the output circuit O1 away from the display area.

The first voltage signal line VGL1 and the second voltage signal line VGH1 extend along a first direction.

In at least one embodiment of the present disclosure, as shown in FIG. 11, the scan driving circuit further includes a third voltage signal line VGH2 and a fourth voltage signal line VGL2, and the fourth voltage signal line VGL2 is used to provide a first voltage, the third voltage signal line VGH2 is used to provide a second voltage; the third voltage signal line VGH2 is located on a side of the first voltage signal line VGL1 away from the display area, and the fourth voltage signal line VGL2 is located on a side of the third voltage signal line VGH2 away from the display area.

The orthographic projection of the first energy storage circuit on the base substrate partially overlaps the orthographic projection of the fourth voltage signal line VGL2 on the base substrate.

The first leakage prevention circuit 12 is located between the first voltage signal line VGL1 and the third voltage signal line VGH2.

As shown in FIGS. 6 and 11-16, the first energy storage circuit may include an output reset capacitor C3 and an output capacitor C2.

In the display substrate according to at least one embodiment of the present disclosure, the orthographic projection of the first energy storage circuit on the base substrate partially overlaps with the orthographic projection of the fourth voltage signal line VGL2 on the base substrate, so as to reduce the width of the shift register unit along the second direction, which facilitates to achieve a narrow frame.

In a specific implementation, the first voltage signal line VGL1, the second voltage signal line VGH1, the third voltage signal line VGH2, and the fourth voltage signal line VGL2 all extend along the first direction.

In at least one embodiment of the present disclosure, as shown in FIG. 11, the at least one shift register unit further includes a reset control circuit 16; the reset control circuit is coupled to the output circuit O1.

The reset control circuit 16 is arranged between the first voltage signal line VGL1 and the second voltage signal line VGH1.

Since the reset control circuit 16 is coupled to the output circuit O1, in the display substrate according to at least one embodiment of the present disclosure, the output circuit O1 and the reset control circuit 16 are both disposed between the first voltage signal line VGL1 and the second voltage signal line VGH1, the reset control circuit 16 can be easily coupled to the output circuit O1, so that the output circuit O1, the reset control circuit 16, the first voltage signal line VGL1 and the second voltage signal line VGH1 can be arranged properly.

As shown in FIGS. 6 and 11-16, the reset control circuit 16 may include a reset control transistor T8.

In a specific implementation, the at least one shift register unit may further include a second node control circuit, a second energy storage circuit, and a second leakage prevention circuit.

The second node control circuit is coupled to a second energy storage circuit; the second leakage prevention circuit is respectively coupled to the first leakage prevention circuit and the first voltage signal line.

The second node control circuit is arranged on a side of the first voltage signal line away from the second voltage signal line.

The orthographic projection of the second energy storage circuit on the base substrate partially overlaps the orthographic projection of the first voltage signal line on the base substrate.

The second leakage prevention circuit is located on a side of the first voltage signal line away from the second voltage signal line.

In at least one embodiment of the present disclosure, the second leakage prevention circuit is respectively coupled to the first voltage signal line and the first leakage prevention circuit, so that the second leakage prevention circuit and the first leakage prevention circuit are both arranged on a side of the first voltage signal line away from the second voltage signal line, which facilitates the coupling of the first leakage prevention circuit and the second leakage prevention circuit, and also facilitates the coupling of the second leakage prevention circuit and the first voltage signal line.

In at least one embodiment of the present disclosure, the orthographic projection of the second energy storage circuit on the base substrate partially overlaps the orthographic projection of the first voltage signal line on the base substrate, so as to narrow the space occupied by the shift register unit along the second direction, which facilitates the realization of a narrow frame.

In at least one embodiment of the present disclosure, the second node control circuit is arranged on a side of the first voltage signal line away from the second voltage signal line, so that the second node control circuit is coupled to the second energy storage circuit.

As shown in FIGS. 6 and 11-16, the second leakage prevention circuit may include a second control transistor T11, the second energy storage circuit may include a first capacitor C1, and the second node control circuit may include a third node control transistor T6 and a fourth node control transistor T7.

In specific implementation, the at least one shift register unit may further include a third node control circuit; the third node control circuit is located on a side of the first voltage signal line away from the second voltage signal line.

As shown in FIGS. 6 and 11-16, the third node control circuit may include an input transistor T1, a first node control transistor T4, and a second node control transistor T5.

As shown in FIG. 11, the scan driving circuit may further include a third voltage signal line VGH2; the third voltage signal line VGH2 is located on the side of the first voltage signal line VGL1 away from the display area; the third node control circuit is coupled to the third voltage signal line VGH2.

The third node control circuit is located between the first voltage signal line VGL1 and the third voltage signal line VGH2, so that the third node control circuit is coupled to the third voltage signal line VGH2.

In at least one embodiment of the present disclosure, as shown in FIG. 11, the at least one shift register unit further includes a fifth node control circuit; the scan driving circuit further includes a third voltage signal line VGH2 and a fourth voltage signal line VGL2; the third voltage signal line VGH2 is located on the side of the first voltage signal line VGL1 away from the display area, and the fourth voltage signal line VGL2 is located on the side of the third voltage signal line VGH2 away from the display area.

The fifth node control circuit is respectively coupled to the fourth voltage signal line VGL2 and the first energy storage circuit.

The fifth node control circuit is located between the third voltage signal line VGH2 and the fourth voltage signal line VGL2.

As shown in FIGS. 6 and 11-16, the fifth node control circuit may include a fifth node control transistor T2 and a sixth node control transistor T3, and the first energy storage circuit may include an output reset capacitor C3 and an output capacitor C2.

As shown in FIGS. 11-16, in at least one embodiment of the present disclosure, the fifth node control circuit is arranged between the third voltage signal line VGH2 and the fourth voltage signal line VGL2 to facilitate the fifth node control circuit to be respectively coupled to the fourth voltage signal line VGL2 and the output capacitor C2 included in the first energy storage circuit.

As shown in FIG. 11, the scan driving circuit further includes a first clock signal line CB and a second clock signal line CK that are arranged on a side of the fourth voltage signal line VGL2 away from the display area.

The first energy storage circuit is coupled to the first clock signal line CB.

Both the first clock signal line CB and the second clock signal line CK extend along a first direction.

As shown in FIGS. 6 and 11-16, the first energy storage circuit may include an output reset capacitor C3 and an output capacitor C2. The second electrode plate C2b of the output capacitor C2 is coupled to the first clock signal line CB.

As shown in FIGS. 11-16, the second voltage signal line, the first voltage signal line, the third voltage signal line, the fourth voltage signal line, the second clock signal line and the first clock signal line are arranged in sequence along the direction away from the display area. Or the second voltage signal line, the first voltage signal line, the third voltage signal line, the fourth voltage signal line, the first clock signal line, and the second clock signal lines are arranged in sequence along the direction away from the display area.

In a specific implementation, the display substrate may further include multiple rows of pixel circuits arranged in the display area on the base substrate; the pixel circuit may include a light emitting control terminal; the shift register unit may further include a signal output line.

The shift register units are in one-to-one correspondence to the rows of pixel circuits.

The signal output line of the shift register unit is coupled to the light emitting control end of the corresponding row of pixel circuits, and is used to provide the light emitting control signal for the light emitting control end of the corresponding row of pixel circuits.

In at least one embodiment of the present disclosure, one stage of shift register unit is used to provide a light emitting control signal for one row of pixel circuits, which can realize PWM fine dimming under low grayscale display conditions, and achieve better display images and effects, and reduce the low gray level Mura (unevenness) of the screen. As shown in FIG. 11, the signal output line may include a first output line portion E01 and a second output line portion E02.

The first output line portion E01 is located between the output circuit O1 and the second voltage signal line VGH1.

The first output line portion E01 is coupled to the second output line portion E02, the first output line portion E01 extends along a first direction, and the second output line portion E02 extends along a second direction. The first direction intersects the second direction.

The second output line portion E02 extends to the display area to provide a light emitting control signal for a row of pixel circuits located in the display area.

Optionally, the output circuit may include an output transistor and an output reset transistor.

The output reset transistor and the output transistor are arranged along a first direction.

The first electrode of the output reset transistor is coupled to the second voltage signal line, and the first electrode of the output transistor is coupled to the first voltage signal line.

Both the second electrode of the output transistor and the second electrode of the output reset transistor are coupled to a signal output line included in the at least one shift register unit.

In at least one embodiment of the present disclosure, the width of the active layer of the output reset transistor along the second direction may be smaller than the width of the active layer of the output transistor along the second direction.

The first direction intersects the second direction.

In at least one embodiment of the present disclosure, the width of the active layer of the output reset transistor along the second direction is smaller than the width of the active layer of the output transistor along the second direction, so that the reset control circuit is arranged in the saved space along the second direction to reduce the width of the shift register unit along the second direction, which is beneficial to realize a narrow frame.

Optionally, the at least one shift register unit further includes a reset control circuit, and the reset control circuit includes a reset control transistor.

The gate electrode of the reset control transistor is coupled to the gate electrode of the output transistor, the first electrode of the reset control transistor is coupled to the first electrode of the output reset transistor, and the second electrode of the reset control transistor is coupled to the gate electrode of the output reset transistor.

As shown in FIGS. 7 and 11, the output circuit O1 may include an output transistor T10 and an output reset transistor T9; the reset control circuit 16 may include a reset control transistor T8.

The output reset transistor T9 and the output transistor T10 are arranged in order from top to bottom.

The first electrode S9 of the output reset transistor T9 is coupled to the second voltage signal line VGH1, and the first electrode S10 of the output transistor T10 is coupled to the first voltage signal line VGL1.

The second electrode D10 of the output transistor T10 and the second electrode D9 of the output reset transistor T9 are both coupled to the first output line portion E01 included in the signal output line.

The gate electrode G8 of the reset control transistor T8 is coupled to the gate electrode G8 of the output transistor T10, and the first electrode S8 of the reset control transistor T8 is coupled to the first electrode S9 of the output reset transistor G9, the second electrode D8 of the reset control transistor T8 is coupled to the gate electrode G9 of the output reset transistor T9.

In at least one embodiment of the present disclosure, the output reset transistor T9 is used to provide an invalid light emitting control signal, and the output transistor T10 is used to provide a valid light emitting control signal.

In at least one embodiment of the present disclosure, the valid light emitting control signal may be a voltage signal capable of turning on the light emitting control transistor in the pixel circuit (the gate electrode of the light emitting control transistor is coupled to the light emitting control line), the invalid light emitting control signal may be a voltage signal capable of turning off the light emitting control transistor.

Specifically, the display area of the display substrate includes a plurality of sub-pixels; at least one of the plurality of sub-pixels includes a pixel driving circuit; the pixel driving circuit includes a transistor, a gate line, a light emitting control line, and a data line; the multiple shift register units included in the scan driving circuit are in one-to-one correspondence to multiple light emitting control lines, and the signal output line of each shift register unit is coupled to the corresponding light emitting control line for providing a light emitting control signal to the corresponding light emitting control line.

In at least one embodiment of the present disclosure, the active layer of the output transistor and the active layer of the output reset transistor are formed by a continuous first semiconductor layer.

The first semiconductor layer and the signal output line are arranged along a first direction.

In specific implementation, the active layer of the output transistor and the active layer of the output reset transistor may be formed by a continuous first semiconductor layer, but it is not limited to this.

In at least one embodiment of the present disclosure, the active layer of the output transistor and the active layer of the output reset transistor may be formed by a continuous first semiconductor layer.

The active layer of the output reset transistor includes at least two first conductive portions arranged opposite to each other along a first direction, and at least one first channel portion; each of the first channel portions is arranged between two adjacent first conductive portions.

The active layer of the output transistor may include at least two second conductive portions arranged opposite to each other along the first direction, and at least one second channel portion; each of the second channel portions is arranged between two adjacent second conductive portions.

The first conductive portion in the active layer of the output reset transistor that is closest to the active layer of the output transistor can be multiplexed as the second conductive portion of the output transistor, which can further reduce the layout space of the output transistor and the output reset transistor, is beneficial to realize the narrow frame of the display substrate.

Figure 12:
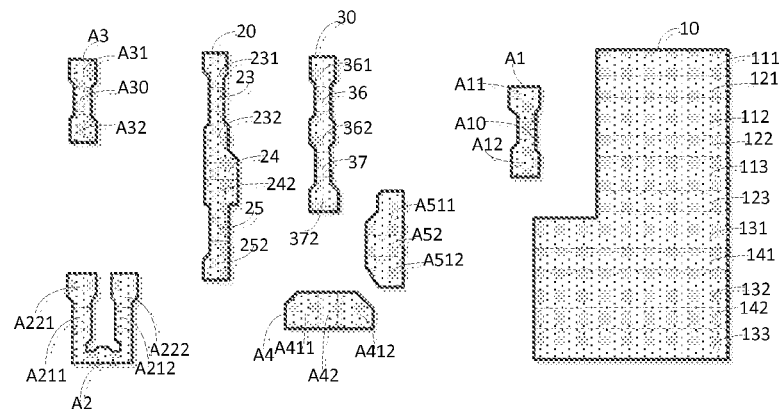
FIG. 12 is a schematic diagram showing an active layer in a display substrate according to at least one embodiment of the present disclosure.

As shown in FIG. 12, the active layer of the output reset transistor T9 and the active layer of the output transistor T10 may be formed by a continuous first semiconductor layer 10.

The active layer of the output reset transistor T9 includes a first first conductive portion 111, a second first conductive portion 112, and a third first conductive portion 113 that are arranged oppositely along a first direction. The active layer of the output reset transistor of T9 also includes a first first channel portion 121, a second first channel portion 122, and a third first channel portion 123.

The first first channel portion 121 is disposed between the first first conductive portion 111 and the second first conductive portion 112, and the second first channel portion 122 is disposed between the second first conductive portion 112 and the third first conductive portion 113; the third first channel portion 123 is disposed between the third first conductive portion 113 and the fourth the first conductive portions.

The active layer of the output transistor T10 further includes a first second conductive portion 131, a second second conductive portion 132, and a third second conductive portion 133 arranged oppositely along the first direction. The active layer of the output transistor T10 also includes a first second channel portion 141 and a second channel portion 142.

The first second conductive portion 131 is multiplexed as a fourth first conductive portion.

The first second channel portion 141 is disposed between the first second conductive portion 131 and the second second conductive portion 132, and the second second channel portion 142 is disposed on the second second conductive portion 132 and the third second conductive portion 133.

In the output reset transistor T9 and the output transistor T10, the conductive portions on both sides of the channel portion of each transistor may correspond to the first electrode and the second electrode of the transistor, or may be coupled to the first electrode of the transistor and the second electrode of the transistor, so that T9 and T10 can be electrically connected through the third first conductive portion 113.

When fabricating the first semiconductor layer 10, for example, the first semiconductor material layer may be formed firstly, and then after the gate electrode G9 of the output reset transistor T9 and the gate electrode G10 of the output transistor T10 are formed, taking the gate electrode G9 of the output reset transistor T9 and the gate electrode G10 of the output transistor T10 as a mask, a portion of the first semiconductor material layer that is not covered by the gate electrode of each transistor is doped, so that the portion of the first semiconductor material layer that is not covered by the gate electrode of each transistor is formed as the conductive portion, and a portion of the first semiconductor material layer that is covered by the gate electrode of each transistor is formed as the channel portion.

According to the specific structure of the above display substrate, in the display substrate according to at least one embodiment of the present disclosure, the output reset transistor T9 and the output transistor T10 in the shift register unit can be arranged along the first direction, which reduces the area occupied by the shift register unit along the second direction, the display substrate is more in line with the development needs of narrow frame.

Specifically, the gate electrode of the output reset transistor may include at least one output reset gate pattern, the first electrode of the output reset transistor includes at least one first electrode pattern, and the second electrode of the output reset transistor includes at least one Second electrode pattern.

The output reset gate pattern is located between the adjacent first electrode pattern and the second electrode pattern.

The second electrode pattern, the output reset gate pattern, and the first electrode pattern all extend along the second direction.

The first direction intersects the second direction.

Specifically, the gate electrode of the output transistor may include at least two output gate patterns arranged along the first direction, the first electrode of the output transistor includes at least one third electrode pattern, and the second electrode of the output transistor includes at least one fourth electrode pattern.

The output reset gate pattern is located between the adjacent third electrode pattern and the fourth electrode pattern.

The fourth electrode pattern, the output gate pattern and the third electrode pattern all extend along the second direction.

The first direction intersects the second direction.

The fourth electrode pattern of the output transistors closest to the gate electrode of the output reset transistor is multiplexed as a second electrode pattern of the output reset transistor.

Figure 16:
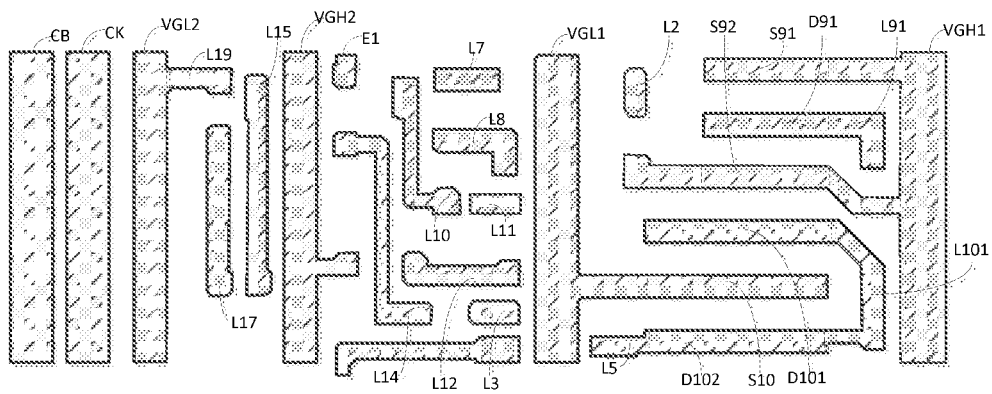
FIG. 16 is a schematic diagram showing a source-drain metal layer in a display substrate according to at least one embodiment of the present disclosure.

In specific implementation, the number of output reset gate patterns, the number of first electrode patterns, the number of second electrode patterns, the number of output gate patterns, and the number of third electrode patterns and the number of the fourth electrode patterns can be set according to actual needs. Exemplarily, as shown in FIGS. 13 and 16, the number of output gate patterns may be two, the number of output reset gate patterns may be three, and the number of first electrode patterns may be two, the number of the second electrode pattern can be two, the number of the third electrode pattern can be one, and the number of the fourth electrode pattern can be two, but it is not limited to this.

In addition, since the second electrode of the output transistor and the second electrode of the output reset transistor are both coupled to the signal output line, when the output transistor and the output reset transistor are laid out, the fourth electrode pattern of the output transistor closest to the gate electrode of the output reset transistor is multiplexed as a second electrode pattern of the output reset transistor, which can further reduce the layout space of the output transistor and the output reset transistor, and is beneficial to realize the narrow frame of the display substrate.

Figure 13:
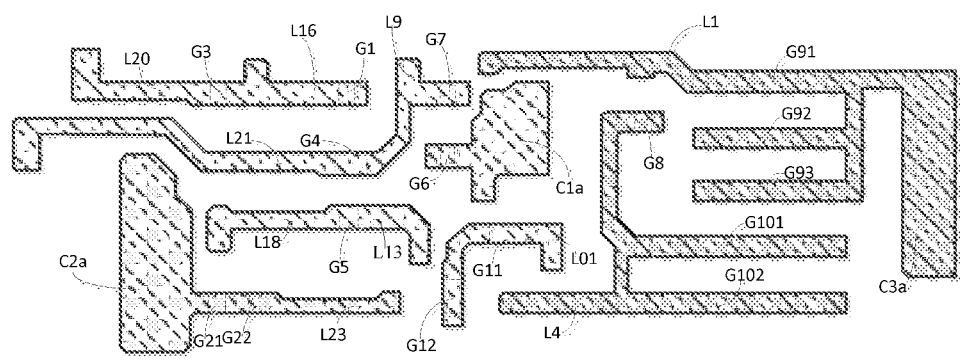
FIG. 13 is a schematic diagram showing a first gate metal layer in a display substrate according to at least one embodiment of the present disclosure.

As shown in FIGS. 11 and 13, in some embodiments, the gate electrode G9 of the output reset transistor T9 may include: a first output reset gate pattern G91, a second output reset gate pattern G92, and a third output reset gate pattern G93.

The gate electrode G10 of the output transistor T10 may include: a first output gate pattern G101 and a second output gate pattern G102.

The first output reset gate pattern G91, the second output reset gate pattern G92, the third output reset gate pattern G93, the first output gate pattern G101, and the second output gate pattern G102 are arranged in sequence along the first direction.

The first output reset gate pattern G91, the second output reset gate pattern G92, the third output reset gate pattern G93, the first output gate pattern G101, and the second output gate pattern G102 all extend along the second direction, and the second direction intersects the first direction.

The first output reset gate pattern G91, the second output reset gate pattern G92, and the third output reset gate pattern G93 are coupled to each other, and the first output gate pattern G101 and the second output gate patterns G102 are coupled to each other.

As shown in FIG. 16, the first electrode S9 of the output reset transistor T9 includes a first first electrode pattern S91 and a second first electrode pattern S92.

The second electrode D9 of the output reset transistor T9 includes a first second electrode pattern D91.

S91, D91, and S92 are sequentially arranged along the first direction, and S91, D91, and S92 all extend along the second direction, and S91 and S92 are both coupled to the second voltage signal line VGH2.

The first fourth electrode pattern D101 is multiplexed as the second second electrode pattern included in the second electrode D9 of the output reset transistor T9; the second electrode D10 of the output transistor T10 includes the first fourth electrode pattern D101 and the second fourth electrode pattern D102.

D101, S10 and D102 are arranged in sequence along the first direction, and D101, S10 and D102 all extend along the second direction.

S10 is coupled to the first voltage signal line VGL1.

As shown in FIG. 11, FIG. 13, FIG. 16, the orthographic projection of G91 on the base substrate is arranged between the orthographic projection of S91 on the base substrate and the orthographic projection of D91 on the base substrate. The orthographic projection of G92 on the base substrate is arranged between the orthographic projection of D91 on the base substrate and the orthographic projection of S92 on the base substrate, and the orthographic projection of G93 on the base substrate is arranged between the orthographic projection of S92 on the base substrate and the orthographic projection of D101 on the base substrate.

The orthographic projection of G101 on the base substrate is arranged between the orthographic projection of D101 on the base substrate and the orthographic projection of S10 on the base substrate, and the orthographic projection of G102 on the base substrate is arranged between the orthographic projection of S10 on the base substrate and the orthographic projection of D102 on the base substrate.

In at least one embodiment of the present disclosure, when at least one shift register unit included in the scan driving circuit is in operation, when T10 is turned on, the shift register unit continuously outputs a low voltage signal, in order to keep the voltage signal applied to the gate electrode of T10 stable, and the gate electrode G10 of T10 should not overlap with the clock signal line.

In a specific implementation, the active layer of the output reset transistor may include at least two first conductive portions arranged oppositely to each other along the first direction, and at least one first channel portion; each of the first channel portions is arranged between two adjacent first conductive portions.

The first channel portions are in one-to-one correspondence to the output reset gate patterns, and the orthographic projection of each first channel portion on the base substrate is located within the orthographic projection of the corresponding output reset gate pattern on the base substrate.

A part of the first conductive portions in the output reset transistor correspond to the first electrode patterns one-to-one, and the orthographic projection of the first electrode pattern on the base substrate and the orthographic projection of the corresponding first conductive portion on base substrate have a first overlap area, and the first electrode pattern is coupled to the corresponding first conductive portion through at least one first via hole provided in the first overlap area.

The other part of the first conductive portions in the output reset transistor correspond to the second electrode patterns one-to-one, and the orthographic projection of the second electrode pattern on the base substrate and the orthographic projection of the corresponding first conductive portion on base substrate have a second overlap area, and the second electrode pattern is coupled to the corresponding first conductive portion through at least one second via hole provided in the second overlap area.

In a specific implementation, the active layer of the output transistor may include at least two second conductive portions arranged oppositely along the first direction, and at least one second channel portion; each of the second channel portions is arranged between two adjacent second conductive portions.

The second channel portions correspond to the output gate patterns one-to-one, and the orthographic projection of each second channel portion on the bae substrate is located within the orthographic projection of the corresponding output gate pattern on the baes substrate.

A part of the second conductive portions in the output transistor correspond to the third electrode patterns one-to-one, and the orthographic projection of the third electrode pattern on the base substrate and the orthographic projection of the corresponding second conductive portion on base substrate have a third overlap area, and the third electrode pattern is coupled to the corresponding second conductive portion through at least one third via hole provided in the third overlap area.

The other part of the second conductive portions in the output transistor correspond to the fourth electrode patterns one-to-one, and the orthographic projection of the fourth electrode pattern on the base substrate and the orthographic projection of the corresponding second conductive portion on base substrate have a fourth overlap area, and the fourth electrode pattern is coupled to the corresponding second conductive portion through at least one fourth via hole provided in the fourth overlap area.

As shown in FIGS. 12, 13, 15 and 16, the first first channel portion 121 corresponds to the first output reset gate pattern G91, and the second first channel portion 122 corresponds to the second output reset gate pattern G92, the third first channel portion 123 corresponds to the third output reset gate pattern G93.

The orthographic projection of the first first channel portion 121 on the base substrate is located within the orthographic projection of G91 on the base substrate.

The orthographic projection of the second first channel portion 122 on the base substrate is located within the orthographic projection of G92 on the base substrate.

The orthographic projection of the third first channel portion 123 on the base substrate is located within the orthographic projection of G93 on the base substrate.

The first first conductive portion 111 corresponds to the first first electrode pattern S91, the second first conductive portion 112 corresponds to the first second electrode pattern D91, and the third first conductive portion 113 corresponds to the second first electrode pattern S92.

The orthographic projection of S91 on the base substrate and the orthographic projection of the first first conductive portion 111 on the base substrate have a first first overlap area, and S91 is coupled to the first first conductive portion through at least one first via hole H1 disposed in the first first overlap area.

The orthographic projection of D91 on the base substrate and the orthographic projection of the second first conductive portion 112 on the base substrate have a first second overlap area, and D91 is coupled to the second first conductive portion 112 through at least one second via hole H2 disposed in the first second overlap area.

The orthographic projection of S92 on the base substrate and the orthographic projection of the third first conductive portion 113 on the base substrate have a second first overlap area, and S92 is coupled to the third first conductive portion 113 through at least one first via hole H1 disposed in the second first overlap area.

The first second channel portion 141 corresponds to the first output gate pattern G101, and the second second channel portion 142 corresponds to the second output gate pattern G102.

The orthographic projection of the first second channel portion 141 on the base substrate is located within the orthographic projection of G101 on the base substrate.

The orthographic projection of the second second channel portion 142 on the base substrate is located within the orthographic projection of G102 on the base substrate.

D101 is multiplexed as the second second electrode pattern; the third first conductive portion 113 is multiplexed as the first second conductive portion.

The first second conductive portion 131 corresponds to the first fourth electrode pattern D101.

The second second conductive portion 132 corresponds to the first electrode S10 of the output transistor, and the third second conductive portion 133 corresponds to the second fourth electrode pattern D102.

The orthographic projection of D101 on the base substrate and the orthographic projection of the first second conductive portion 131 on the base substrate have a first fourth overlap area, and D102 is are coupled to the first second conductive portion 131 through at least one first fourth via hole H4 provided in the first fourth overlap area.

The orthographic projection of S10 on the base substrate and the orthographic projection of the second second conductive portion 132 on the base substrate have a third overlap area. S10 is coupled to the second second conductive portion 132 through at least one third via hole H3 provided in the third overlap area.

The orthographic projection of D102 on the base substrate and the orthographic projection of the third second conductive portion 133 on the base substrate have a second fourth overlapping area, and D102 is coupled to the third second conductive portion 133 through at least one fourth via hole H4 provided in the second fourth overlapping area.

In at least one embodiment of the present disclosure, the number of first via holes, the number of second via holes, the number of third via holes, and the number of fourth via holes can be set according to actual needs.

In the display substrate provided by the above embodiment, the first semiconductor layer 10 is used to form the active layer of the output reset transistor T9 and the active layer of the output transistor T10, which not only makes the space occupied by T9 and T10 along the second direction smaller, but also increases the size of the active layer of the output reset transistor T9 and the size the active layer of the output transistor T10 along the first direction to ensure the channel width of T9 and the channel width of T10, so as to ensure the working performance of T9 and T10 and reduce the frame width of the display substrate.

Figure 14:
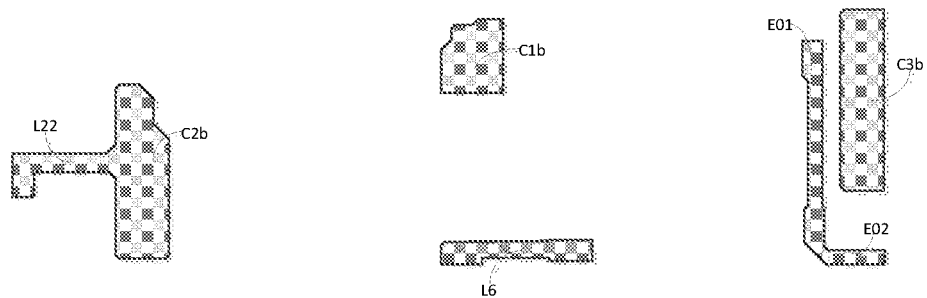
FIG. 14 is a schematic diagram showing a second gate metal layer in a display substrate according to at least one embodiment of the present disclosure.

As shown in FIGS. 11, 12 and 14, the orthographic projection of the first output line portion E01 in the signal output line on the base substrate is located between the orthographic projection of the first semiconductor layer 10 on the base substrate and the orthographic projection of the second voltage signal line VGH1 on the base substrate, to facilitate the coupling of the second electrode of the output transistor and the second electrode of the output reset transistor with the signal output line.

Figure 15:
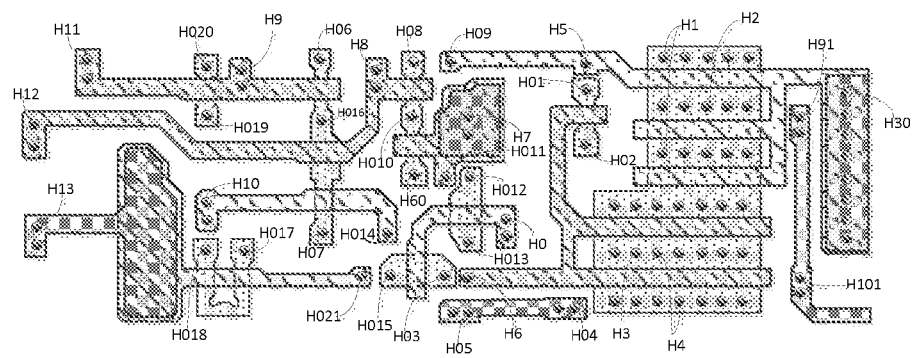
FIG. 15 is a schematic diagram showing a via hole used in a display substrate according to at least one embodiment of the present disclosure.

In at least one embodiment of the present disclosure, FIG. 12 is a schematic diagram of the active layer in FIG. 11, FIG. 13 is a schematic diagram of the first gate metal layer in FIG. 11, and FIG. 14 is a schematic diagram of the second gate metal layer in FIG. 11, FIG. 15 is a schematic diagram of via holes made after the active layer, the first gate metal layer and the second gate metal layer are sequentially arranged, and FIG. 16 is a schematic diagram of the source-drain metal layers in FIG. 11.

In specific implementation, an active layer, a first gate metal layer, a second gate metal layer, a via hole, and a source-drain metal layer are sequentially arranged on the base substrate to form a display substrate.

In at least one embodiment of the present disclosure, in addition to the output transistor and the output reset transistor, the at least one shift register unit may also include a plurality of transistors; the conductive portions on both sides of the channel portion of each transistor may be the first electrode and the second electrode of the transistor, or can be respectively coupled to the first electrode of the transistor and the second electrode of the transistor.

In at least one embodiment of the present disclosure, as shown in FIG. 12, the reset control transistor T8 may be located between the output reset transistor T9 and the first voltage signal line VGL1, and a width of the active layer of the output reset transistor T9 along the second direction may be smaller than a width of the active layer of the output transistor T10 along the second direction.

The first direction intersects the second direction.

The reset control transistor T8 includes a first active pattern A1, and the first active pattern A1 extends along a first direction.

As shown in FIG. 12, the first active pattern A1 includes a first reset control conductive portion A11, a reset control channel portion A10, and a second reset control conductive portion A12 sequentially arranged along the first direction.

The first reset control conductive portion A11 serves as the first electrode S8 of T8, and the second reset control conductive portion A12 serves as the second electrode D8 of T8.

In FIG. 12, by setting the width W1 of the active layer of the output reset transistor T9 along the second direction to be smaller than the width W2 of the active layer of the output transistor T10 along the second direction, and setting T8 between T9 and VGL1, T8 is arranged in the saved space along the second direction, and the first active pattern A1 extends along the first direction to reduce the width of the shift register unit along the second direction, which is conducive to achieving a narrow frame.

Optionally, the at least one shift register unit may further include an output reset capacitor.

The orthographic projection of the second electrode plate of the output reset capacitor on the base substrate is within the orthographic projection of the first electrode plate of the output reset capacitor on the base substrate.

The orthographic projection of the second electrode plate of the output reset capacitor on the base substrate partially overlaps the orthographic projection of the second voltage signal line on the base substrate.

The first electrode plate of the output reset capacitor is coupled to the gate electrode of the output reset transistor in the output circuit.

The second electrode plate of the output reset capacitor is coupled to the second voltage signal line through an electrode plate connection via hole.

In at least one embodiment of the present disclosure, the orthographic projection of the second electrode plate of the output reset capacitor on the base substrate partially overlaps the orthographic projection of the second voltage signal line on the base substrate, to reduce the width of the shift register unit along the second direction which facilitates the realization of a narrow frame and the coupling of the second electrode plate of the output reset capacitor with the second voltage signal line.

As shown in FIGS. 11-16, the at least one shift register unit may include an output reset transistor T9, an output transistor T10, a reset control transistor T8, and an output reset capacitor C3.

The gate electrode G9 of T9 is coupled to the first electrode plate C3a of C3, the first electrode S9 of T9 is coupled to the second voltage signal line VGH2, and the second electrode D9 of T9 is coupled to the first output line portion E01.

The gate electrode G10 of T10 is coupled to the first electrode S12 of T12, the first electrode S10 of T10 is coupled to the first voltage signal line VGL1, and the second electrode D10 of T10 is coupled to the first output line portion E01.

The gate electrode G8 of T8 is coupled to the gate electrode G10 of T10.

The first electrode G9 of T9 is coupled to the first conductive connection portion L1.

The second electrode D8 of T8 is coupled to the second conductive connection portion L2 through the first connection via hole H01, and there is a fifth overlap area between the second conductive connection portion L2 and the first conductive connection portion L1, the second conductive connection portion L2 is coupled to the first conductive connection portion L1 through a fifth via hole H5 provided in the fifth overlapping area.

The first electrode S8 of T8 is coupled to the second first electrode pattern S92 included in the first electrode S9 of the output reset transistor T9 through the second connection via hole H02, and S92 is coupled to the second voltage signal line VGH1, so that the first electrode S8 of T8 is coupled to the second voltage signal line VGH1.

The first electrode plate C3a of C3 is coupled to the gate electrode G9 of T9.

The second electrode plate C3b of C3 is coupled to the second voltage signal line VGH1 through the electrode plate connection via hole H30.

In at least one embodiment of the present disclosure, the first leakage prevention circuit may include a first control transistor; the output circuit may include an output transistor.

The first control transistor is located on a side of the first voltage signal line away from the display area.

The first electrode of the first control transistor is coupled to the gate electrode of the output transistor.

In a specific implementation, the at least one shift register unit may include a first leakage prevention circuit and a second leakage prevention circuit, the first leakage prevention circuit includes a first control transistor, and the second leakage prevention circuit includes a second control transistor; the output circuit includes an output transistor.

The first control transistor and the second control transistor are located on a side of the first voltage signal line away from the display area.

The gate electrode of the first control transistor and the gate electrode of the second control transistor are coupled to each other.

The gate electrode of the second control transistor is coupled to an electrode conductive connection portion, and there is an electrode overlap area between the orthographic projection of the electrode conductive connection portion on the base substrate and the orthographic projection of the first voltage signal line on the base substrate, the electrode conductive connection portion is coupled to the first voltage signal line through an electrode connection via hole provided in the electrode overlap area.

The first electrode of the first control transistor is coupled to the gate electrode of the output transistor.

In at least one embodiment of the present disclosure, the at least one shift register unit may include a first leakage prevention circuit and a second leakage prevention circuit to prevent leakage of the output transistor and prevent leakage of the transistor whose gate electrode is coupled to the fourth node. The gate electrode of the first control transistor included in the first leakage prevention circuit and the gate electrode of the second control transistor included in the second leakage prevention circuit are coupled to each other, and the gate electrode of the second control transistor is coupled to the first voltage signal line, and the first control transistor and the second control transistor are arranged close to the first voltage signal line to facilitate the coupling between the gate electrode of the second control transistor and the first voltage signal line, and facilitate the coupling between the gate electrode of the first control transistor and the gate electrode of the second control transistor.

As shown in FIGS. 11 to 16, the at least one shift register unit may include a first leakage prevention circuit and a second leakage prevention circuit, the first leakage prevention circuit includes a first control transistor T12, and the second leakage prevention leakage circuit includes a second control transistor T11; the output circuit O1 includes an output transistor T10.

The first control transistor T12 and the second control transistor T11 are located on the side of the first voltage signal line VGL1 away from the display area.

The gate electrode G12 of the first control transistor T12 and the gate electrode G11 of the second control transistor T11 are coupled to each other.

The gate electrode G11 of the second control transistor T11 is coupled to an electrode conductive connection portion L01, and the orthographic projection of the electrode conductive connection portion L01 on the base substrate and the orthographic projection of the first voltage signal line VGL1 on the base substrate have an electrode overlap area, and the electrode conductive connection portion L01 is coupled to the first voltage signal line VGL1 through an electrode connection via hole H0 provided in the electrode overlap area.

The first electrode S12 of the first control transistor T12 is coupled to the third conductive connection portion L3 through the third connection via hole H03, the gate electrode G10 of T10 is coupled to the fourth conductive connection portion L4, and there is a sixth overlap area between the third conductive connection portion L3 and the fourth conductive connecting portion L4, and the third conductive connecting portion L3 is connected to the fourth conductive connecting portion L4 through a sixth via hole H6 provided in the sixth overlap area, so that the first electrode S12 of T12 is coupled to the gate electrode G10 of T10.

As shown in FIGS. 11-16, the first control transistor T12 includes a fourth active pattern A4.

The fourth active pattern A4 includes a first control conductive portion A411, a first control channel portion A42, and a second control conductive portion A412 that are sequentially arranged along the second direction.

A411 is used as the second electrode D12 of T12, and A412 is used as the first electrode S12 of T12.

The second control transistor T11 includes a fifth active pattern A5.

The fifth active pattern A5 includes a third control conductive portion A511, a second control channel portion A52, and a fourth control conductive portion A512 that are sequentially arranged along the first direction.

A511 is used as the first electrode S11 of T11, and A512 is used as the second electrode D11 of T11.

T11 and T12 are arranged on the side of the first voltage signal line VGL1 away from the display area.

As shown in FIGS. 11-16, D102 is coupled to the fifth conductive connection portion L5, and the fifth conductive connection portion L5 is coupled to the sixth conductive connection portion L6 through the fourth connection via hole H04. The sixth connecting portion L6 is included in the second gate metal layer.

The sixth conductive connection portion L6 is coupled to a carry signal line E11 through a fifth connection via hole H05. The carry signal line E11 can provide an input signal for the (n+1)th stage of shift register unit. The carry signal line E11 can be included in the source-drain metal layers, but is not limited to this.

In at least one embodiment of the present disclosure, the scan driving circuit may further include a third voltage signal line; the third voltage signal line is used to provide a second voltage; the at least one shift register unit further includes a third node control circuit; the third node control circuit includes an input transistor, a first node control transistor and a second node control transistor.

The active layer of the input transistor, the active layer of the first node control transistor and the active layer of the second node control transistor are formed by a continuous second semiconductor layer.

The second semiconductor layer extends along the first direction.

The active layer of the input transistor includes a first third conductive portion, a third channel portion, and a second third conductive portion sequentially arranged along a first direction.

The second third conductive portion is multiplexed as the first fourth conductive portion.

The active layer of the first node control transistor includes a first fourth conductive portion, a fourth channel portion, and a second fourth conductive portion sequentially arranged along a first direction.

The second fourth conductive portion is multiplexed as the first fifth conductive portion.

The active layer of the second node control transistor includes a first fifth conductive portion, a fifth channel portion, and a second fifth conductive portion sequentially arranged along the first direction.

The first electrode of the input transistor is coupled to the input terminal, and the first electrode of the second node control transistor is coupled to the third voltage signal line.

In specific implementation, the second voltage may be a high voltage Vh, but is not limited to this.

In at least one embodiment of the present disclosure, the active layer of the input transistor, the active layer of the first node control transistor, and the active layer of the third node control transistor are formed by a continuous second semiconductor layer, and the second semiconductor layer extends along the first direction, so that the space occupied by the input transistor, the first node control transistor and the second node control transistor along the second direction can be reduced, which is beneficial to realize a narrow frame. Moreover, in at least one embodiment of the present disclosure, the second third conductive portion is multiplexed as the first fourth conductive portion, and the second fourth conductive portion is multiplexed as the first fifth conductive portion, so as to reduce the horizontal width of the shift register unit while reducing the vertical height of the shift register unit.

As shown in FIGS. 11-16, the scan driving circuit may further include a third voltage signal line VGH2; the third voltage signal line VGH2 is used to provide a high voltage Vh; the at least one shift register unit includes an input transistor T1, the first node control transistor T4 and the second node control transistor T5.

The active layer of the input transistor T1, the active layer of the first node control transistor T4, and the active layer of the second node control transistor T5 are formed by a continuous second semiconductor layer 20.

The second semiconductor layer 20 extends along the first direction.

The active layer of the input transistor T1 includes a first third conductive portion 231, a third channel portion 23, and a second third conductive portion 232 sequentially arranged along the first direction.

The second third conductive portion 232 is multiplexed as the first fourth conductive portion.

The active layer of the first node control transistor T4 includes a first fourth conductive portion, a fourth channel portion 24, and a second fourth conductive portion 242 sequentially arranged along the first direction.

The second fourth conductive portion 242 is multiplexed as the first fifth conductive portion.

The active layer of the second node control transistor T5 includes a first fifth conductive portion, a fifth channel portion 25, and a second fifth conductive portion 252 sequentially arranged along the first direction.

The first electrode S1 of the input transistor T1 is coupled to the input terminal E1 through the sixth connection via hole H06, and the first electrode S5 of the second node control transistor T5 is connected to the third voltage signal line VGH2 through the seventh connection via hole H07.

In at least one embodiment of the present disclosure, the first third conductive portion 231 is used as the first electrode S1 of T1, the second third conductive portion 232 is used as the second electrode D1 of T1, and the second fourth conductive portion 242 is used as the first electrode S4 of the first node control transistor T4, and the second fifth conductive portion 252 is used as the first electrode of the second node control transistor T5; the second electrode D1 of T1 is multiplexed as the second electrode D4 of T4, the first electrode S4 of T4 is multiplexed as the second electrode D5 of T5.

Optionally, the input transistor, the first node control transistor, and the second node control transistor are located between the third voltage signal line and the first voltage signal line.

The third voltage signal line extends along a first direction, and the third voltage signal line is located on a side of the first voltage signal line away from the display area.

As shown in FIGS. 11-16, the third voltage signal line VGH2 extends along the first direction, the third voltage signal line VGH2 is located on the side of the first voltage signal line VGL1 away from the display area, and T1, T4, and T5 are provided between VGH2 and VGL1.

In specific implementation, the at least one shift register unit may further include a second energy storage circuit and a second node control circuit; the second energy storage circuit includes a first capacitor, and the second node control circuit includes a third node control transistor and a fourth node control transistor.

The active layer of the fourth node control transistor and the active layer of the third node control transistor are formed by a continuous third semiconductor layer; the third semiconductor layer extends along the first direction.

The active layer of the fourth node control transistor includes a first sixth conductive portion, a sixth channel portion, and a second sixth conductive portion sequentially arranged along the first direction.

The second sixth conductive portion is multiplexed as the first seventh conductive portion.

The active layer of the third node control transistor includes a first seventh conductive portion, a seventh channel portion, and a second seventh conductive portion sequentially arranged along the first direction.

The gate electrode of the fourth node control transistor is coupled to the gate electrode of the first node control transistor, and the second electrode of the fourth node control transistor is coupled to the gate electrode of the output reset transistor.

The gate electrode of the third node control transistor is coupled to the first electrode plate of the first capacitor, and the first electrode of the third node control transistor is coupled to the gate electrode of the first node control transistor.

The second sixth conductive portion is used as the second electrode of the third node control transistor and the first electrode of the fourth node control transistor.

The first electrode of the fourth node control transistor is coupled to the second electrode plate of the first capacitor.

In at least one embodiment of the present disclosure, the active layer of the third node control transistor and the active layer of the fourth node control transistor are formed by a continuous third semiconductor layer; the third semiconductor layer extends along the first direction, so as to reduce the space occupied by the third node control transistor and the fourth node control transistor along the second direction, which is beneficial to realize a narrow frame. Moreover, in at least one embodiment of the present disclosure, the second sixth conductive portion is multiplexed as the first seventh conductive portion, so as to reduce the lateral width of the shift register unit while reducing the vertical height of the shift register the unit.

As shown in FIGS. 11-16, the at least one shift register unit may further include a first capacitor C1, a third node control transistor T6, and a fourth node control transistor T7.

The active layer of the fourth node control transistor T7 and the active layer of the third node control transistor T3 are formed by a continuous third semiconductor layer 30; the third semiconductor layer 30 extends along the first direction.

The active layer of the fourth node control transistor T7 includes a first sixth conductive portion 361, a sixth channel portion 36, and a second sixth conductive portion 362 sequentially arranged along the first direction.

The second sixth conductive portion 362 is multiplexed as the first seventh conductive portion.

The active layer of the third node control transistor T6 includes a first seventh conductive portion, a seventh channel portion 37, and a second seventh conductive portion 372 sequentially arranged along the first direction.

The first sixth conductive portion 361 serves as the second electrode D7 of T7, and the second seventh conductive portion 372 serves as the first electrode S6 of T6.

The gate electrode G7 of the fourth node control transistor T7 is coupled to the gate electrode G4 of the first node control transistor T4, and the second electrode D7 of the fourth node control transistor T7 is coupled to the gate electrode G7 of the output reset transistor T9.

The gate electrode G6 of the third node control transistor T6 is coupled to the first electrode plate C1a of the first capacitor C1, and the first electrode S6 of the third node control transistor T6 is coupled to the gate electrode G4 of the first node control transistor T4.

The second sixth conductive portion 362 serves as the second electrode D6 of the third node control transistor T6 and the first electrode S7 of the fourth node control transistor T7.

The first electrode S7 of the fourth node control transistor T7 is coupled to the second electrode plate C1b of the first capacitor C1.

As shown in FIGS. 11-16, T6 and T7 can be set between VGH2 and VGL1.

As shown in FIGS. 11-16, the second electrode D7 of T7 is coupled to the seventh conductive connection portion L7 through the eighth connection via hole H08, and the seventh conductive connection portion L7 is connected to the first conductive connection portion L2 through the ninth connection via hole H09.

The first electrode S7 of T7 is coupled to the eighth conductive connection portion L8 through the tenth connection via hole H010, and there is a seventh overlap area between the eighth conductive connection portion L8 and the second electrode plate C1b of the first capacitor C1, the eighth conductive connection portion L8 is coupled to the second electrode plate C1b of the first capacitor C1 through a seventh via hole H7 provided in the seventh overlap area.

The gate electrode G7 of T7 is coupled to the gate electrode G4 of T4 through the ninth conductive connection portion L9; the first electrode S6 of T6 is coupled to the tenth conductive connection portion L10 through the connection via hole H60; there is an eighth overlap area between the tenth conductive connection portion L10 and the ninth conductive connecting portion L9, and the tenth conductive connection portion L10 is coupled to the ninth conductive connection portion L9 through an eighth via hole H8 provided in the eighth overlap area, so that the first electrode S6 of T6 is coupled to the gate electrode G4 of T4.

In at least one embodiment of the present disclosure, the orthographic projection of the second electrode plate of the first capacitor on the base substrate is within the orthographic projection of the first electrode plate of the first capacitor on the base substrate.

The orthographic projection of the second electrode plate of the first capacitor on the base substrate partially overlaps the orthographic projection of the first voltage signal line on the base substrate.

The third node control transistor and the fourth node control transistor are located on a side of the first capacitor away from the display area.

In at least one embodiment of the present disclosure, the orthographic projection of the second electrode plate of the first capacitor on the base substrate partially overlaps the orthographic projection of the first voltage signal line on the base substrate to narrow the space occupied by the shift register unit along the second direction and facilitate to achieve a narrow frame.

As shown in FIGS. 11-16, the orthographic projection of the second electrode plate C1b of the first capacitor C1 on the base substrate is within the orthographic projection of the first electrode plate C1a of the first capacitor C1 on the base substrate.

The orthographic projection of the second electrode plate C1b of the first capacitor C1 on the base substrate partially overlaps the orthographic projection of the first voltage signal line VGL1 on the base substrate.

The third node control transistor T6 and the fourth node control transistor T7 are located on the side of the first capacitor C1 away from the display area.

C1, T11, and T12 are arranged in sequence along the first direction, and T11 and T12 is set in the space below C1 to reduce the occupied horizontal width.

As shown in FIGS. 11-16, the first electrode plate C1a of C1 is coupled to the eleventh conductive connection portion L11 through the eleventh connection via hole H011, and the first electrode S11 of T11 is connected to the eleventh conductive connection portion L11 through the twelfth connection via hole H012, so that the first electrode S11 of T11 is coupled to the first electrode plate C1a of C1.

The second electrode D11 of T11 is coupled to the twelfth conductive connection portion L12 through the thirteenth connection via hole H013, and the twelfth conductive connection portion L12 is coupled to the thirteenth conductive connection portion L13 through the fourteenth connection via hole H014, the thirteenth conductive connecting portion L13 is coupled to the gate electrode G5 of T5, so that the second electrode D11 of T11 is coupled to the gate electrode G5 of T5.

The second electrode D12 of T12 is coupled to the fourteenth conductive connection portion L14 through the fifteenth connection via hole H015, and the second electrode D1 of T1 is coupled to the fourteenth conductive connection portion L14 through the sixteenth connection via hole H016, so that the second electrode D1 of T1 is coupled to the second electrode D12 of T12.

In a specific implementation, the scan driving circuit may further include a third voltage signal line, and the third voltage signal line is used to provide a second voltage.

The at least one shift register unit includes a first leakage prevention circuit, a second leakage prevention circuit, an input transistor, a first node control transistor, a second node control transistor, a third node control transistor, and a fourth node control transistor.

The first leakage prevention circuit includes a first control transistor, and the second leakage prevention circuit includes a second control transistor.

The first control transistor, the second control transistor, the input transistor, the first node control transistor, the second node control transistor, the third node control transistor, and the fourth node control transistor are located between the third voltage signal line and the first voltage signal line.

The third voltage signal line extends along a first direction, and the third voltage signal line is located on a side of the first voltage signal line away from the display area.

In at least one embodiment of the present disclosure, a first control transistor, the second control transistor, the input transistor, the first node control transistor, the second node control transistor, the third node control transistor, and the fourth node control transistor may be located between the third voltage signal line and the first voltage signal line, and the third voltage signal line may be located on a side of the first voltage signal line away from the display area.

Optionally, the at least one shift register unit may further include a fifth node control circuit, and the fifth node control circuit includes a fifth node control transistor.

The fifth node control transistor includes a second active pattern, and the second active pattern is a U-shaped structure.

The second active pattern includes a first fifth node control channel portion, a second fifth node control channel portion, a first fifth node control channel portion coupled to the first fifth node control channel portion, and a second fifth node control conductive portion coupled to the second fifth node control channel portion.

The gate electrode of the fifth node control transistor includes a first gate pattern and a second gate pattern that are coupled to each other.

The first gate pattern corresponds to the first fifth node control channel portion, and the second gate pattern corresponds to the second fifth node control channel portion.

The first fifth node control conductive portion serves as the second electrode of the fifth node control transistor, and the second fifth node control conductive portion serves as the first electrode of the fifth node control transistor.

As shown in FIGS. 11-16, the at least one shift register unit may further include a fifth node control transistor T2.

The fifth node control transistor T2 includes a second active pattern A2, and the second active pattern A2 is a U-shaped structure.

The second active pattern A2 includes a first fifth node control channel portion A211, a second fifth node control channel portion A212, a first fifth node control conductive portion A221 coupled to the first fifth node control channel portion A211, and the second fifth node control conductive portion A222 coupled to the second fifth node control channel portion A212.

The gate electrode G2 of the fifth node control transistor T2 includes a first gate pattern G21 and a second gate pattern G22 coupled to each other.

The first gate pattern G21 corresponds to the first fifth node control channel portion A211, and the second gate pattern G22 corresponds to the second fifth node control channel portion A212.

The first fifth node control conductive portion A221 serves as the second electrode D2 of the fifth node control transistor T2, and the second fifth node control conductive portion A222 serves as the first electrode S2 of the fifth node control transistor T2.

As shown in FIGS. 11 and 12, the active pattern of the fifth node control transistor T2 is configured as a U-shaped structure, so that T2 is formed as a double gate structure. The purpose of the double-gate structure design is: in the second phase P2, when the shift register unit included in the scan driving circuit outputs a high voltage signal, T10 should be completely turned off, and the high level of the gate electrode of T10 is applied by the source electrode of T5. Therefore, in the second phase P2, it is necessary to ensure that T5 is turned on, that is, the potential of the fifth node N5 needs to be low; and in the second phase P2, the potential of the gate electrode of T2 is high, to avoid the increase of the potential of the fifth node N5 due to the current leakage of T2, so T2 is set by a double-gate design, which makes it easier to turn off T2.

In actual exposure, if the active pattern of T2 is set to a U-shape without missing corners, metal will be deposited after exposure, which will make the U-shaped active pattern become a V-shape. Therefore, in actual products, taking into account the actual exposure process, a small portion of the U-shaped active pattern is dug in two right-angle portions for compensation, and the actual pattern is made to be U-shaped as much as possible, without affecting the width to length ratio of T2.

As shown in FIGS. 1-16, the first electrode S2 of T2 is coupled to the fifteenth conductive connection portion L15 through the seventeenth connection via hole H017, and the gate electrode G1 of T1 is coupled to the sixteenth conductive connection portion L16, there is a ninth overlap area between the fifteenth conductive connection portion L15 and the sixteenth conductive connection portion L16, and the fifteenth conductive connection portion L15 is connected to the sixteenth conductive connection portion L16 through the ninth via hole H9 provided in the ninth overlap area, so that the first electrode S2 of T2 is coupled to the gate electrode G1 of T1.

The sixteenth conductive connection portion L16 is also coupled to the gate electrode G3 of T3, so that the first electrode S2 of T2 is coupled to the gate electrode G3 of T3.

The second electrode D2 of T2 is coupled to the seventeenth conductive connection portion L17 through the eighteenth connection via hole H018, the gate electrode G5 of T5 is coupled to the eighteenth conductive connection portion L18, and there is a tenth overlap area between the seventeenth conductive connection portion L17 and the eighteenth conductive connecting portions L18, and the seventeenth conductive connecting portion L17 is coupled to the eighteenth conductive connecting portion L18 through a tenth via hole H10 provided in the tenth overlap area, so that the second electrode D2 of T2 is coupled to the gate electrode G5 of T5.

The second electrode D3 of T3 is coupled to the seventeenth conductive connection portion L17 through the nineteenth connection via hole H019, so that the second electrode D3 of T3 is coupled to the second electrode D2 of T2.

The gate electrode G2 of T2 is coupled to the first electrode plate C2a of the output capacitor C2.

Optionally, the at least one shift register unit may further include a fifth node control circuit, and the fifth node control circuit includes a sixth node control transistor.

The sixth node control transistor includes a third active pattern, and the third active pattern extends along a first direction.

In at least one embodiment of the present disclosure, the at least one shift register unit may further include a sixth node control transistor, the sixth node control transistor and the fifth node control transistor are arranged along the first direction, and the third active pattern included in the sixth node control transistor extends along the first direction to reduce the width occupied by the shift register unit along the second direction.

As shown in FIGS. 11-16, the at least one shift register unit may further include a sixth node control transistor T2.

The sixth node control transistor T2 includes a third active pattern A3, and the third active pattern A3 extends along a first direction.

The third active pattern A3 includes a first eighth conductive portion A31, an eighth channel portion A30, and a second eighth conductive portion A32.

A31 is used as the first electrode S3 of T3, and A32 is used as the second electrode D3 of T3.

The sixteenth conductive connection portion L16 is also coupled to the gate electrode G3 of T3, so that the first electrode S2 of T2 is coupled to the gate electrode G3 of T3.

The second electrode D3 of T3 is coupled to the seventeenth conductive connection portion L17 through the nineteenth connection via hole H019, so that the second electrode D3 of T3 is coupled to the second electrode D2 of T2.

The first electrode S3 of T3 is coupled to the nineteenth conductive connection portion L19 through the twentieth connection via hole H020. The nineteenth conductive connection portion L19 is coupled to the fourth voltage signal line VGL2 so that the first electrode S3 of T3 is coupled to the fourth voltage signal line VGL2.

The fourth voltage signal line VGL2 may provide a first voltage, and the first voltage may be a low voltage VL, but is not limited to this.

As shown in FIGS. 11, T2 and T3 are arranged between VGH2 and VGL2, and both VGH2 and VGL2 extend along the first direction.

In a specific implementation, the scan driving circuit may further include a fourth voltage signal line, and the fourth voltage signal line is used to provide a first voltage; the first energy storage circuit may include an output capacitor.

The orthographic projection of the second electrode plate of the output capacitor on the base substrate is within the orthographic projection of the first electrode plate of the output capacitor on the base substrate.

The orthographic projection of the second electrode plate of the output capacitor on the base substrate partially overlaps the orthographic projection of the fourth voltage signal line on the base substrate.

The width of the second electrode plate of the output capacitor along the second direction is smaller than a first predetermined width, and the length of the second electrode plate of the output capacitor along the first direction is greater than a first predetermined length.

The fourth voltage signal line extends along the first direction.

In at least one embodiment of the present disclosure, the fourth voltage signal line is arranged on the side of the third voltage signal line away from the display area, and the electrode plates of the output capacitor are arranged to overlap the fourth voltage signal line to reduce the width occupied by the shift registrar unit along the second direction, the width of the second electrode plate of the output capacitor along the second direction is set to be smaller than the first predetermined width, and the length of the second electrode plate of the output capacitor along the first direction is set to be greater than the first predetermined length, to ensure the area of the second electrode plate of the output capacitor while narrowing the lateral width.

Optionally, the first predetermined width is 20 microns, and the first predetermined length is 22 microns, but not limited to this.

In at least one embodiment of the present disclosure, the scan driving circuit may further include a third voltage signal line and a fourth voltage signal line, the fourth voltage signal line is used to provide the first voltage; the third voltage signal line is used to provide a second voltage; the third voltage signal line is located on the side of the first voltage signal line away from the display area, and the fourth voltage signal line is located on the side of the third voltage signal line away from the display area.

The first energy storage circuit includes an output capacitor; the at least one shift register unit further includes a fifth node control circuit, and the fifth node control circuit includes a fifth node control transistor and a sixth node control transistor.

The fifth node control transistor and the sixth node control transistor are located between the third voltage signal line and the fourth voltage signal line.

The first electrode of the sixth node control transistor is coupled to the fourth voltage signal line, and the second electrode of the sixth node control transistor is coupled to the second electrode of the fifth node control transistor.

The first electrode of the fifth node control transistor is coupled to the gate electrode of the sixth node control transistor.

The orthographic projection of the second electrode plate of the output capacitor on the base substrate is within the orthographic projection of the first electrode plate of the output capacitor on the base substrate; the orthographic projection of the second electrode plate of the output capacitor on the base substrate partially overlaps the orthographic projection of the fourth voltage signal line on the base substrate.

The first electrode plate of the output capacitor is coupled to the gate electrode of the fifth node control transistor.

The third voltage signal line and the fourth voltage signal line extend along a first direction.

In a specific implementation, the fifth node control transistor and the sixth node control transistor can be arranged between the third voltage signal line and the fourth voltage signal line, and the orthographic projection of the second electrode plate of the output capacitor on the base substrate partially overlaps the orthographic projection of the fourth voltage signal line on the base substrate.

Optionally, the scan driving circuit may further include a first clock signal line and a second clock signal line that are arranged on a side of the fourth voltage signal line away from the display area.

The second electrode plate of the output capacitor is coupled to the first clock signal line.

The gate electrode of the sixth node control transistor is coupled to the second clock signal line.

Both the first clock signal line and the second clock signal line extend along a first direction.

As shown in FIGS. 11-16, the scan driving circuit may further include a first clock signal line CB and a second clock signal line CK that are arranged on a side of the fourth voltage signal line VGL2 away from the display area.

The first clock signal line CB and the second clock signal line CK may both extend along the first direction.

The gate electrode of T3 is coupled to the twentieth conductive connection portion L20, and there is an eleventh overlap area between the twentieth conductive connection portion L20 and the second clock signal line CK, and the twentieth conductive connection portion L20 is coupled to the second clock signal line CK through the eleventh via hole H11 provided in the eleventh overlap area.

The gate electrode of T4 is coupled to the twenty-first conductive connection portion L21, there is a twelfth overlap area between the twenty-first conductive connection portion L21 and the first clock signal line CB, and the twenty-first conductive connection portion L21 is coupled to the first clock signal line CB through a twelfth via hole H12 provided in the twelfth overlap area.

The gate electrode G2 of T2 is coupled to the first electrode plate C2a of C2.

The second electrode plate C2b of C2 is coupled to the twenty-second conductive connection portion L22. There is a thirteenth overlap area between the twenty-second conductive connection portion L22 and the first clock signal line CB. The twenty-second conductive connecting portion L22 is coupled to the first clock signal line CB through a thirteenth via hole H13 provided in the thirteenth overlapping area.

As shown in FIGS. 7 and 11-16, the second electrode D12 of T12 is coupled to the fourteenth conductive connection portion L14 through the fifteenth connection via hole H015, and the gate electrode G2 of T2 is connected to the twenty-third conductive connection portion L23. The twenty-third conductive connection portion L23 is coupled to the fourteenth conductive connection portion L14 through the twenty-first connection via hole H021, so that the gate electrode G2 of T2 is coupled to the second electrode D12 of T12.

In the layout shown in FIG. 11, VGL2, CK, and CB are arranged in order along the direction away from the display area, but in actual operation, VGL2, CB, and CK may be arranged in order along the direction away from the display area.

As shown in FIGS. 7 and 11-16, the first second electrode pattern D91 in the second electrode D9 of the output reset transistor T9 is coupled to the first output line conductive connection portion L91.

There is a first output line overlap portion between the first output line conductive connection portion L91 and the first output line portion E01, and L91 is coupled to the first output line portion E01 through the first output line via hole H91 provided in the first output line overlap portion, so that D91 and E01 are coupled to each other.

D101 and D102 are both coupled to the second output line conductive connection portion L101. There is a second output line overlap portion between the second output line conductive connection portion L101 and the first output line portion E01. L101 is coupled to the first output line portion E01 through the second output line via hole H101 provided in the second output line overlapping portion, so that D101 and D102 are respectively coupled to E01.

In at least one embodiment of the present disclosure, the scan driving circuit may further include a third voltage signal line, a fourth voltage signal line, a first clock signal line, and a second clock signal line. The third voltage signal line, the fourth voltage signal line, the first clock signal line and the second clock signal line all extend along a first direction.

Along the direction away from the display area, the second voltage signal line, the first voltage signal line, the third voltage signal line, the fourth voltage signal line, the second clock signal line, and the first clock signal lines are arranged in sequence. Or along the direction away from the display area, the second voltage signal line, the first voltage signal line, the third voltage signal line, the fourth voltage signal line, the first clock signal line, and the second clock signal lines are arranged in sequence.

Specifically, the specific positions of the first clock signal line, the second clock signal line, and the fourth voltage signal line can be set according to actual needs. For example, the first clock signal line, the second clock signal line and the fourth voltage signal line are all arranged at the edge of the display substrate, that is, the orthographic projection of the fourth voltage signal line on the base substrate, the orthographic projection of the first clock signal line on the base substrate and the orthographic projection of the second clock signal line on the base substrate are all located on a side of the orthographic projection of the shift register unit on the base substrate away from the display area of the display substrate. When the shift register unit is laid out, excessive overlapping between the transistors in the shift register unit and the first clock signal line, the second clock signal line, and the fourth voltage signal line can be avoided, which is more conducive to improving the working performance of the shift register unit.

In addition, by arranging the first clock signal line, the second clock signal line, and the fourth voltage signal line to extend along the first direction, it is more advantageous for the display substrate to realize a narrow frame.

In specific implementation, the phase of the first clock signal outputted by the first clock signal line is reverse to the phase of the second clock signal outputted by the second clock signal line, but not limited to this.

In at least one embodiment of the present disclosure, as shown in FIGS. 7 and 11-16, the scan driving circuit includes a first voltage signal line VGL1, a second voltage signal line VGH1, a third voltage signal line VGH2, and a fourth voltage signal line VGL2, the first clock signal line CB, and the second clock signal line CK. The output circuit O1 includes an output transistor T10 and an output reset transistor T9; the first leakage prevention circuit 12 includes a first control transistor T12. The at least one shift register unit further includes a signal output line, a second control transistor T11, an input transistor T1, a first node control transistor T4, a second node control transistor T5, a third node control transistor T6, a fourth node control transistor T7, a fifth node control transistor T2, a sixth node control transistor T3 and a reset control transistor T8.

The reset control transistor T8, the output transistor T10, and the output reset transistor G9 are arranged between the first voltage signal line VGL1 and the second voltage signal line VGH1.

The first control transistor T12, the second control transistor T11, the input transistor T1, the first node control transistor T4, the second node control transistor T5, the third node control transistor T6, and the fourth node control transistor T7 are located between the first voltage signal line VGL1 and the third voltage signal line VGH2.

The fifth node control transistor T2 and the sixth node control transistor T3 are located between the third voltage signal line VGH2 and the fourth voltage signal line VGL2.

The signal output line includes a first output line portion E01 and a second output line portion E02.

The first output line portion E01 is located between the output circuit O1 and the second voltage signal line VGH1.

The first output line portion E01 is coupled to the second output line portion E02, the first output line portion E01 extends along a first direction, and the second output line portion E02 extends along a second direction. The first direction intersects the second direction;

The second output line portion E02 extends to the display area.

In at least one embodiment of the present disclosure, T8, T9, and T10 can be set between VGH1 and VGL1, T1, T4, T5, T6, T7, T11, and T12 can be set between VGL1 and VGH2, and T2 and T3 can be set between VGH2 and VGL2, T9 and T10 are arranged in sequence along the first direction, T8 is arranged between G9 and VGL1, T1, T4 and T5 are arranged in sequence along the first direction, T7 and T6 are arranged in sequence along the first direction, T11 and T12 is arranged under T6, T2 and T3 are arranged between VGH2 and VGL2, and T3 and T2 are arranged along the first direction.

Optionally, the first energy storage circuit includes an output capacitor and an output reset capacitor; the at least one shift register unit may also include a first capacitor.

The orthographic projection of the second electrode plate of the first capacitor on the base substrate partially overlaps the orthographic projection of the first voltage signal line on the base substrate, or the first capacitor is located between the first voltage signal line and the fourth node control transistor.

The orthographic projection of the second electrode plate of the first capacitor on the base substrate is located within the orthographic projection of the first electrode plate of the first capacitor on the base substrate.

The orthographic projection of the second electrode plate of the output reset capacitor on the base substrate is within the orthographic projection of the first electrode plate of the output reset capacitor on the base substrate.

The orthographic projection of the second electrode plate of the output reset capacitor on the base substrate partially overlaps the orthographic projection of the second voltage signal line on the base substrate.

The orthographic projection of the second electrode plate of the output capacitor on the base substrate is within the orthographic projection of the first electrode plate of the output capacitor on the base substrate.

The orthographic projection of the second electrode plate of the output capacitor on the base substrate partially overlaps the orthographic projection of the fourth voltage signal line on the base substrate.

In at least one embodiment of the present disclosure, the at least one shift register unit may further include a first capacitor, an output capacitor, and an output reset capacitor, and the orthographic projection of the second electrode plate of the first capacitor on the base substrate partially overlaps the orthographic projection of the first voltage signal line on the base substrate, and the orthographic projection of the second electrode plate of the output reset capacitor on the base substrate partially overlaps the orthographic projection of the second voltage signal line on the base substrate, and the orthographic projection of the second electrode plate of the output capacitor on the base substrate partially overlaps the orthographic projection of the fourth voltage signal line on the base substrate, so as to narrow the width occupied by the shift register unit along the second direction.

As shown in FIGS. 6, 7 and 11-16, the at least one shift register unit may further include a first capacitor C1, an output capacitor C2, and an output reset capacitor C3.

The orthographic projection of the second electrode plate C1$b$ of the first capacitor C1 on the base substrate partially overlaps the orthographic projection of the first voltage signal line VGL1 on the base substrate.

The orthographic projection of the second electrode plate C1$b$ of the first capacitor C1 on the base substrate is located within the orthographic projection of the first electrode plate C1a of the first capacitor C1 on the base substrate.

The orthographic projection of the second electrode plate C3$b$ of the output reset capacitor C3 on the base substrate is located within the orthographic projection of the first electrode plate C3$a$ of the output reset capacitor C3 on the base substrate.

The orthographic projection of the second electrode plate C3$b$ of the output reset capacitor C3 on the base substrate partially overlaps the orthographic projection of the second voltage signal line VGH1 on the base substrate.

The orthographic projection of the second electrode plate C2$b$ of the output capacitor C2 on the base substrate is located within the orthographic projection of the first electrode plate C2$a$ of the output capacitor C2 on the base substrate.

The orthographic projection of the second electrode plate C2$b$ of the output capacitor C2 on the base substrate partially overlaps the orthographic projection of the fourth voltage signal line VGL2 on the base substrate.

In the layout shown in FIG. 11, the overlapping area between the electrode plate of C2 and VGL2 is large, and the overlapping area between the electrode plate of C3 and VGH1 is also large, in order to fully save the spaced occupied by the electrode plate of C2 and the electrode plate of C3.

During specific implementation, the third voltage signal line, the fourth voltage signal line, the first clock signal line, and the second clock signal line all extend along a first direction.

Along the direction away from the display area, the second voltage signal line, the first voltage signal line, the third voltage signal line, the fourth voltage signal line, the second clock signal line, and the first clock signal lines are arranged in sequence. Or along the direction away from the display area, the second voltage signal line, the first voltage signal line, the third voltage signal line, the fourth voltage signal line, the first clock signal line, and the second clock signal lines are arranged in sequence.

In at least one embodiment of the present disclosure, a first gate insulating layer may be provided between the semiconductor layer shown in FIG. 12 and the first gate metal layer shown in FIG. 13; a second gate insulating layer may also be provided between the first gate metal layer shown in FIG. 13 and the second gate metal layer shown in FIG. 14. An insulating layer may also be included between the second gate metal layer shown in FIG. 14 and the source-drain metal layer shown in FIG. 15.

When manufacturing the display substrate according to at least one embodiment of the present disclosure, a semiconductor material layer is firstly provided on the base substrate, and the semiconductor material layer is patterned to form the active layer of each transistor; as shown in FIG. 12, a first semiconductor layer 10, a second semiconductor layer 20, a third semiconductor layer 30, a first active pattern A1 included in the reset control transistor T8, and a second active pattern A2 included in the fifth node control transistor T2 and a third active pattern A3 included in the sixth node control transistor T2 are formed.

A first gate insulating layer is formed on a side of the active layer away from the base substrate.

A first gate metal layer is formed on a side of the first gate insulating layer facing away from the active layer, and a patterning process is performed on the first gate metal layer. As shown in FIG. 13, the gate electrodes of transistors included in the shift register unit, the first electrode plate of the output reset capacitor C3, the first electrode plate of the first capacitor C1, and the first electrode plate of the output capacitor C2 are formed.

Using the gate electrodes of each transistors as a mask, a portion of the active layer that is not covered by the gate electrodes is doped, so that the portion of the active layer that is not covered by the gate electrodes is formed as a conductive portion, A portion of the active layer that is covered by the gate electrodes is formed as a channel portion; the conductive portion is used as a first electrode or a second electrode; or the conductive portion is coupled to the first electrode or the second electrode.

A second gate insulating layer is arranged on a side of the first gate metal layer facing away from the first gate metal layer.

A second gate metal layer is arranged on a side of the second gate insulating layer facing away from the first gate metal layer, and a patterning process is performed on the second gate metal layer, as shown in FIG. 14, the signal output line, a second electrode plate of the output reset capacitor C3, the second electrode plate of the first capacitor C1 and the second electrode plate of the output capacitor C2 are formed.

An insulating layer is arranged on a side of the second gate metal layer facing away from the second gate insulating layer.

As shown in FIG. 15, a plurality of via holes are provided on the base substrate provided with the active layer, the first gate insulating layer, the first gate metal layer, the second gate insulating layer, the second gate metal layer and the insulating layer.

A source-drain metal layer is provided on a side of the insulating layer away from the second gate metal layer, and a patterning process is performed on the source-drain metal layer. As shown in FIG. 16, a first voltage signal line VGL1, a second voltage signal line VGH1, a third voltage signal line VGH2, a fourth voltage signal line VGL2, a first clock signal line CB, a second clock signal line CB, an input terminal E1, a second electrode of the output reset transistor T9, a first electrode of the output reset transistor T9, a second electrode of the output transistor T10, and a first electrode of the output transistor T10 are formed.

The manufacturing method of the display substrate according to at least one embodiment of the present disclosure includes forming a first voltage signal line, a second voltage signal line, and a scan driving circuit on a base substrate. The scan driving circuit includes a plurality of shift register units, at least one shift register unit of the plurality of shift register units includes an output circuit, a first energy storage circuit, and a first leakage prevention circuit. The output circuit is connected to the first voltage signal line and the second voltage signal, respectively. The first energy storage circuit is respectively coupled to the output circuit and the second voltage signal line, and the first leakage prevention circuit is coupled to the output circuit.

The manufacturing method of the display substrate further includes: forming the first voltage signal line on a side of the second voltage signal line away from the display area; forming the output circuit between the first voltage signal line and the second voltage signal line; setting an orthographic projection of the first energy storage circuit on the base substrate to partially overlap an orthographic projection of the second voltage signal line on the base substrate; forming the first leakage prevention circuit on a side of the first voltage signal line away from the second voltage signal line.

The first voltage signal line is used to provide a first voltage, and the second voltage signal line is used to provide a second voltage.

In at least one embodiment of the present disclosure, since the output circuit is respectively coupled to the first voltage signal line and the second voltage signal line, the output circuit is arranged between the first voltage signal line and the second voltage signal line, so as to reduce the length of a connection line between the output circuit and the first voltage signal line, and the length of a connection line between the output circuit and the second voltage signal line, so that the output circuit, the first voltage signal line and the second voltage signal line can be reasonably laid out.

In at least one embodiment of the present disclosure, the orthographic projection of the first energy storage circuit on the base substrate is set to partially overlap the orthographic projection of the second voltage signal line on the base substrate, to reduce the width of shift register unit along the second direction, which facilitates the realization of a narrow frame and the coupling of the first energy storage circuit and the second voltage signal line.

In at least one embodiment of the present disclosure, the at least one shift register unit may include a first leakage prevention circuit to prevent leakage of an output transistor included in the output circuit. In at least one embodiment of the present disclosure, the first leakage prevention circuit is arranged on a side of the first voltage signal line away from the second voltage signal line, the first leakage prevention circuit can be easily coupled to the first voltage signal line.

The display device according to at least one embodiment of the present disclosure includes the above-mentioned display substrate.

The display device provided by at least one embodiment of the present disclosure may be any product or component with a display function, such as a mobile phone, a tablet computer, a television, a monitor, a notebook computer, a digital photo frame, and a navigator.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a scan driving circuit provided on a base substrate, wherein the scan driving circuit includes a plurality of shift register units, at least one shift register unit of the plurality of shift register units comprises an output circuit, a first energy storage circuit and a first leakage prevention circuit, the scan driving circuit further includes a first voltage signal line and a second voltage signal line, the first voltage signal line is used to provide a first voltage, the second voltage signal line is used to provide a second voltage;
   the first voltage signal line is located on a side of the second voltage signal line away from a display area;
   the output circuit is respectively coupled to the first voltage signal line and the second voltage signal line, the first energy storage circuit is respectively coupled to the output circuit and the second voltage signal line, the first leakage prevention circuit is respectively coupled to the output circuit and the first voltage signal line;
   the output circuit is arranged between the first voltage signal line and the second voltage signal line;
   an orthographic projection of the first energy storage circuit on the base substrate partially overlaps an orthographic projection of the second voltage signal line on the base substrate;
   the first leakage prevention circuit is arranged on a side of the first voltage signal line away from the second voltage signal line.

2. The display substrate according to claim 1, wherein the at least one shift register unit further comprises a reset control circuit; the reset control circuit is coupled to the output circuit;
   the reset control circuit is arranged between the first voltage signal line and the second voltage signal line.

3. The display substrate according to claim 1, wherein the at least one shift register unit further comprises a second node control circuit, a second energy storage circuit, and a second leakage prevention circuit;
   the second node control circuit is coupled to the second energy storage circuit; the second leakage prevention circuit is respectively coupled to the first leakage prevention circuit and the first voltage signal line;
   the second node control circuit is arranged on the side of the first voltage signal line away from the second voltage signal line;
   an orthographic projection of the second energy storage circuit on the base substrate partially overlaps an orthographic projection of the first voltage signal line on the base substrate;
   the second leakage prevention circuit is located on the side of the first voltage signal line away from the second voltage signal line.

4. The display substrate according to claim 1, wherein the at least one shift register unit further comprises a fifth node control circuit; the scan driving circuit further comprises a third voltage signal line and a fourth voltage signal line; the third voltage signal line is located on the side of the first voltage signal line away from the display area, and the fourth voltage signal line is located on a side of the third voltage signal line away from the display area;
   the fifth node control circuit is respectively coupled to the fourth voltage signal line and the first energy storage circuit;
   the fifth node control circuit is located between the third voltage signal line and the fourth voltage signal line.

5. The display substrate according to claim 1, wherein the first energy storage circuit includes an output reset capacitor; the output circuit includes an output reset transistor;
   an orthographic projection of a second electrode plate of the output reset capacitor on the base substrate is within an orthographic projection of a first electrode plate of the output reset capacitor on the baes substrate;
   the orthographic projection of the second electrode plate of the output reset capacitor on the base substrate partially overlaps an orthographic projection of the second voltage signal line on the base substrate;
   the first electrode plate of the output reset capacitor is coupled to a gate electrode of the output reset transistor;
   the second electrode plate of the output reset capacitor is coupled to the second voltage signal line through an electrode plate connection via hole.

6. The display substrate according to claim 1, wherein the first leakage prevention circuit includes a first control transistor; the output circuit includes an output transistor;
   the first control transistor is located on the side of the first voltage signal line away from the display area;
   a first electrode of the first control transistor is coupled to a gate electrode of the output transistor.

7. The display substrate according to claim 1, wherein the at least one shift register unit further comprises a second leakage prevention circuit; the second leakage prevention circuit includes a second control transistor, and the first leakage prevention circuit includes a first control transistor;
   the second control transistor is located on the side of the first voltage signal line away from the display area; a gate electrode of the first control transistor and a gate electrode of the second control transistor are coupled to each other;
   the gate electrode of the second control transistor is coupled to an electrode conductive connection portion, and there is an electrode overlap area between an orthographic projection of the electrode conductive connection portion on the base substrate and an orthographic projection of the first voltage signal line on the base substrate, the electrode conductive connection portion is coupled to the first voltage signal line through an electrode connection via hole provided in the electrode overlap area.

8. The display substrate according to claim 1, wherein the at least one shift register unit further comprises a fifth node control circuit, and the fifth node control circuit comprises a fifth node control transistor;
the fifth node control transistor includes a second active pattern, and the second active pattern is a U-shaped structure;
the second active pattern includes a first fifth node control channel portion, a second fifth node control channel portion, a first fifth node control conductive portion coupled to the first fifth node control channel portion, and a second fifth node control conductive portion coupled to the second fifth node control channel portion;
a gate electrode of the fifth node control transistor includes a first gate pattern and a second gate pattern that are coupled to each other;
the first gate pattern corresponds to the first fifth node control channel portion, and the second gate pattern corresponds to the second fifth node control channel portion;
the first fifth node control conductive portion serves as a second electrode of the fifth node control transistor, and the second fifth node control conductive portion serves as a first electrode of the fifth node control transistor.

9. The display substrate according to claim 1, wherein the at least one shift register unit further comprises a fifth node control circuit, and the fifth node control circuit comprises a sixth node control transistor;
the sixth node control transistor includes a third active pattern, and the third active pattern extends along a first direction.

10. A display device comprising the display substrate according to claim 1.

11. The display substrate according to claim 1, wherein the at least one shift register unit further comprises a third node control circuit; the third node control circuit is located on the side of the first voltage signal line away from the second voltage signal line.

12. The display substrate according to claim 11, wherein the scan driving circuit further comprises a third voltage signal line; the third voltage signal line is located on the side of the first voltage signal line away from the display area; the third node control circuit is coupled to the third voltage signal line;
the third node control circuit is located between the first voltage signal line and the third voltage signal line.

13. The display substrate according to claim 1, wherein the display substrate further comprises a plurality of rows of pixel circuits arranged in the display area on the base substrate; the pixel circuit comprises a light emitting control terminal; the shift register unit further includes a signal output line;
one shift register unit corresponds to one row of pixel circuits;
the signal output line of the shift register unit is coupled to the light emitting control end of the corresponding row of pixel circuits, and is configured to provide a light emitting control signal for the light emitting control end of the corresponding row of pixel circuits.

14. The display substrate according to claim 13, wherein the signal output line includes a first output line portion and a second output line portion;

the first output line portion is located between the output circuit and the second voltage signal line;
the first output line portion is coupled to the second output line portion, the first output line portion extends along a first direction, and the second output line portion extends along a second direction, the first direction intersects the second direction;
the second output line portion extends to the display area to provide the light emitting control signal for a row of pixel circuits located in the display area.

15. The display substrate according to claim 1, wherein the output circuit includes an output transistor and an output reset transistor;
the output reset transistor and the output transistor are arranged along a first direction;
a first electrode of the output reset transistor is coupled to the second voltage signal line, and a first electrode of the output transistor is coupled to the first voltage signal line;
both a second electrode of the output transistor and a second electrode of the output reset transistor are coupled to a signal output line included in the at least one shift register unit.

16. The display substrate according to claim 15, wherein a width of an active layer of the output reset transistor along a second direction is smaller than a width of an active layer of the output transistor along the second direction, the first direction intersects the second direction.

17. The display substrate according to claim 1, wherein the at least one shift register unit further includes a reset control circuit; the reset control circuit includes a reset control transistor; the output circuit includes an output transistor and an output reset transistor;
a gate electrode of the reset control transistor is coupled to a gate electrode of the output transistor, a first electrode of the reset control transistor is coupled to a first electrode of the output reset transistor, and a second electrode of the reset control transistor is coupled to a gate electrode of the output reset transistor.

18. The display substrate according to claim 17, wherein the reset control transistor is located between the output reset transistor and the first voltage signal line;
the reset control transistor includes a first active pattern, and the first active pattern extends along a first direction.

19. The display substrate according to claim 1, wherein the scan driving circuit further comprises a third voltage signal line; the third voltage signal line is used to provide a second voltage; the at least one shift register unit further comprises a third node control circuit; the third node control circuit includes an input transistor, a first node control transistor, and a second node control transistor;
an active layer of the input transistor, an active layer of the first node control transistor and an active layer of the second node control transistor are formed by a continuous second semiconductor layer;
the second semiconductor layer extends along the first direction;
the active layer of the input transistor includes a first third conductive portion, a third channel portion, and a second third conductive portion sequentially arranged along a first direction;
the second third conductive portion is multiplexed as a first fourth conductive portion;
the active layer of the first node control transistor includes the first fourth conductive portion, a fourth channel portion, and a second fourth conductive portion sequentially arranged along a first direction;

the second fourth conductive portion is multiplexed as a first fifth conductive portion;

the active layer of the second node control transistor includes the first fifth conductive portion, a fifth channel portion, and a second fifth conductive portion sequentially arranged along the first direction;

a first electrode of the input transistor is coupled to the input terminal, and a first electrode of the second node control transistor is coupled to the third voltage signal line.

20. The display substrate according to claim 19, wherein the input transistor, the first node control transistor, and the second node control transistor are located between the third voltage signal line and the first voltage signal line;

the third voltage signal line extends along the first direction, and the third voltage signal line is located on the side of the first voltage signal line away from the display area.

21. The display substrate according to claim 1, wherein the at least one shift register unit further comprises a second energy storage circuit and a second node control circuit; the second energy storage circuit includes a first capacitor, the second node control circuit includes a third node control transistor and a fourth node control transistor;

an active layer of the fourth node control transistor and an active layer of the third node control transistor are formed by a continuous third semiconductor layer; the third semiconductor layer extends along the first direction;

the active layer of the fourth node control transistor includes a first sixth conductive portion, a sixth channel portion, and a second sixth conductive portion sequentially arranged along the first direction;

the second sixth conductive portion is multiplexed into a first seventh conductive portion;

an active layer of the third node control transistor includes the first seventh conductive portion, a seventh channel portion, and a second seventh conductive portion sequentially arranged along the first direction;

a gate electrode of the fourth node control transistor is coupled to a gate electrode of the first node control transistor, and a second electrode of the fourth node control transistor is coupled to a gate electrode of the output reset transistor;

a gate electrode of the third node control transistor is coupled to a first electrode plate of the first capacitor, and a first electrode of the third node control transistor is coupled to a gate electrode of the first node control transistor;

the second sixth conductive portion is used as a second electrode of the third node control transistor and a first electrode of the fourth node control transistor;

the first electrode of the fourth node control transistor is coupled to a second electrode plate of the first capacitor.

22. The display substrate according to claim 21, wherein an orthographic projection of the second electrode plate of the first capacitor on the base substrate is within an orthographic projection of the first electrode plate of the first capacitor on the base substrate;

the orthographic projection of the second electrode plate of the first capacitor on the base substrate partially overlaps an orthographic projection of the first voltage signal line on the substrate;

the third node control transistor and the fourth node control transistor are located on a side of the first capacitor away from the display area.

23. The display substrate according to claim 1, wherein the scan driving circuit further comprises a fourth voltage signal line, the fourth voltage signal line is configured to provide a first voltage; the first energy storage circuit includes an output capacitor;

an orthographic projection of a second electrode plate of the output capacitor on the base substrate is within an orthographic projection of a first electrode plate of the output capacitor on the base substrate;

the orthographic projection of the second electrode plate of the output capacitor on the base substrate partially overlaps an orthographic projection of the fourth voltage signal line on the base substrate;

a width of the second electrode plate of the output capacitor along the second direction is smaller than a first predetermined width, and a length of the second electrode plate of the output capacitor along the first direction is greater than a first predetermined length;

the fourth voltage signal line extends along the first direction.

24. The display substrate according to claim 23, wherein the first predetermined width is 20 microns and the first predetermined length is 22 microns.

25. The display substrate according to claim 1, wherein the scan driving circuit further comprises a third voltage signal line, a fourth voltage signal line, a first clock signal line, and a second clock signal line; the output circuit includes an output transistor and an output reset transistor; the first leakage prevention circuit includes a first control transistor; the at least one shift register unit further includes a signal output line, a second control transistor, an input transistor, a first node control transistor, a second node control transistor, a third node control transistor, a fourth node control transistor, a fifth node control transistor, a sixth node control transistor, and a reset control transistor;

the reset control transistor, the output transistor and the output reset transistor are arranged between the first voltage signal line and the second voltage signal line;

the first control transistor, the second control transistor, the input transistor, the first node control transistor, the second node control transistor, the third node control transistor, and the fourth node control transistor are located between the first voltage signal line and the third voltage signal line;

the fifth node control transistor and the sixth node control transistor are located between the third voltage signal line and the fourth voltage signal line;

the signal output line includes a first output line portion and a second output line portion;

the first output line portion is located between the output circuit and the second voltage signal line;

the first output line portion is coupled to the second output line portion, the first output line portion extends along a first direction, and the second output line portion extends along a second direction, the first direction intersects the second direction;

the second output line portion extends to the display area.

26. The display substrate according to claim 25, wherein the first energy storage circuit includes an output capacitor and an output reset capacitor; the at least one shift register unit further includes a first capacitor;

an orthographic projection of a second electrode plate of the first capacitor on the base substrate partially overlaps the orthographic projection of the first voltage signal line on the base substrate, or the first capacitor is located between the first voltage signal line and the fourth node control transistor;

the orthographic projection of the second electrode plate of the first capacitor on the base substrate is within an orthographic projection of a first electrode plate of the first capacitor on the base substrate;

an orthographic projection of a second electrode plate of the output reset capacitor on the base substrate is within an orthographic projection of a first electrode plate of the output reset capacitor on the base substrate;

the orthographic projection of the second electrode plate of the output reset capacitor on the base substrate partially overlaps the orthographic projection of the second voltage signal line on the base substrate;

an orthographic projection of a second electrode plate of the output capacitor on the base substrate is within an orthographic projection of a first electrode plate of the output capacitor on the base substrate;

an orthographic projection of the second electrode plate of the output capacitor on the substrate partially overlaps an orthographic projection of the fourth voltage signal line on the base substrate.

27. The display substrate according to claim 1, wherein the scan driving circuit further comprises a third voltage signal line and a fourth voltage signal line, the fourth voltage signal line is used to provide the first voltage, the third voltage signal line is used to provide the second voltage; the third voltage signal line is located on the side of the first voltage signal line away from the display area, and the fourth voltage signal line is located on a side of the third voltage signal line away from the display area;

the orthographic projection of the first energy storage circuit on the base substrate partially overlaps an orthographic projection of the fourth voltage signal line on the base substrate;

the first leakage prevention circuit is located between the first voltage signal line and the third voltage signal line.

28. The display substrate according to claim 27, wherein: the first energy storage circuit includes an output capacitor; the at least one shift register unit further includes a fifth node control circuit, and the fifth node control circuit includes a fifth node control transistor and a sixth node control transistor;

the fifth node control transistor and the sixth node control transistor are located between the third voltage signal line and the fourth voltage signal line;

a first electrode of the sixth node control transistor is coupled to a fourth voltage signal line, and a second electrode of the sixth node control transistor is coupled to a second electrode of the fifth node control transistor;

a first electrode of the fifth node control transistor is coupled to a gate electrode of the sixth node control transistor;

an orthographic projection of a second electrode plate of the output capacitor on the base substrate is within an orthographic projection of a first electrode plate of the output capacitor on the base substrate; the orthographic projection of the second electrode plate of the output capacitor on the base substrate partially overlaps an orthographic projection of the fourth voltage signal line on the base substrate;

the first electrode plate of the output capacitor is coupled to a gate electrode of the fifth node control transistor;

the third voltage signal line and the fourth voltage signal line extend along the first direction.

29. The display substrate according to claim 28, wherein the scan driving circuit further comprises a first clock signal line and a second clock signal line that are arranged on a side of the fourth voltage signal line away from the display area;

the second electrode plate of the output capacitor is coupled to the first clock signal line;

a gate electrode of the sixth node control transistor is coupled to the second clock signal line;

both the first clock signal line and the second clock signal line extend along a first direction.

30. The display substrate according to claim 27, wherein the first voltage signal line, the second voltage signal line, the third voltage signal line, and the fourth voltage signal line all extend along a first direction.

31. The display substrate according to claim 30, wherein the scan driving circuit further comprises a first clock signal line and a second clock signal line that are arranged on a side of the fourth voltage signal line away from the display area;

the first energy storage circuit is coupled to the first clock signal line;

both the first clock signal line and the second clock signal line extend along the first direction.

32. The display substrate according to claim 31, wherein the second voltage signal line, the first voltage signal line, the third voltage signal line, the fourth voltage signal line, the second clock signal line and the first clock signal line are arranged sequence along a direction away from the display area; or the second voltage signal line, the first voltage signal line, the third voltage signal line, the fourth voltage signal line, the first clock signal line, and the second clock signal lines are arranged in sequence along the direction away from the display area.

33. A method for manufacturing a display substrate, comprising forming a first voltage signal line, a second voltage signal line, and a scan driving circuit on a base substrate; wherein the scan driving circuit includes a plurality of shift register units, and at least one shift register unit of the plurality of shift register units includes an output circuit, a first energy storage circuit and a first leakage prevention circuit, the output circuit is respectively coupled to the first voltage signal line and the second voltage signal line, the first energy storage circuit is respectively coupled to the output circuit and the second voltage signal line, and the first leakage prevention circuit is coupled to the output circuit;

wherein the method for manufacturing the display substrate further comprises:

forming the first voltage signal line on a side of the second voltage signal line away from the display area;

forming the output circuit between the first voltage signal line and the second voltage signal line;

setting an orthographic projection of the first energy storage circuit on the base substrate to partially overlap an orthographic projection of the second voltage signal line on the base substrate;

forming the first leakage prevention circuit on a side of the first voltage signal line away from the second voltage signal line;

wherein the first voltage signal line is configured to provide a first voltage, and the second voltage signal line is configured to provide a second voltage.

* * * * *